(12) United States Patent
Nguyen et al.

(10) Patent No.: US 10,128,148 B2
(45) Date of Patent: Nov. 13, 2018

(54) METHODS FOR FABRICATING SEMICONDUCTOR DEVICES INCLUDING SURFACE TREATMENT PROCESSES

(71) Applicant: Samsung Electronics Co., Ltd., Suwon-si, Gyeonggi-do (KR)

(72) Inventors: Viet Ha Nguyen, Yongin-si (KR); Nae In Lee, Seoul (KR); Thomas Oszinda, Hwaseong-si (KR); Byung Hee Kim, Seoul (KR); Jong Min Baek, Seoul (KR); Tae Jin Yim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/636,889

(22) Filed: Jun. 29, 2017

(65) Prior Publication Data

US 2018/0102280 A1    Apr. 12, 2018

(30) Foreign Application Priority Data

Oct. 11, 2016    (KR) ........................ 10-2016-0131088

(51) Int. Cl.
*H01L 21/768*    (2006.01)

(52) U.S. Cl.
CPC .. *H01L 21/76826* (2013.01); *H01L 21/76814* (2013.01); *H01L 21/76877* (2013.01); *H01L 21/76888* (2013.01)

(58) Field of Classification Search
None
See application file for complete search history.

(56) References Cited

U.S. PATENT DOCUMENTS

| | | |
|---|---|---|
| 5,882,826 A | 3/1999 | Kato et al. |
| 6,962,870 B2 | 11/2005 | Masuda et al. |
| 7,064,382 B2 | 6/2006 | Kodama et al. |
| 7,084,077 B2 | 8/2006 | Kaji et al. |
| 7,119,441 B2 | 10/2006 | Ohto et al. |
| 7,161,231 B2 | 1/2007 | Koike |
| 7,172,965 B2 | 2/2007 | Inukai et al. |
| 7,176,121 B2 | 2/2007 | Ohmori et al. |
| 7,176,123 B2 | 2/2007 | Kim et al. |
| 7,180,191 B2 | 2/2007 | Sasaki et al. |
| 7,205,636 B2 | 4/2007 | Koike |
| 7,217,648 B2 | 5/2007 | Lu et al. |

(Continued)

OTHER PUBLICATIONS

US 8,987,729, 03/2015, Kaneko et al. (withdrawn)

*Primary Examiner* — Robert Bachner
*Assistant Examiner* — Molly Reida
(74) *Attorney, Agent, or Firm* — Myers Bigel, P.A.

(57) ABSTRACT

Methods for fabricating semiconductor devices may provide enhanced performance and reliability by recovering quality of a low-k insulating film damaged by a plasma process. A method may include forming a first interlayer insulating film having a trench therein on a substrate, filling at least a portion of the trench with a metal wiring region, exposing a surface of the metal wiring region and a surface of the first interlayer insulating film to a plasma in a first surface treatment process, then exposing the surface of the first interlayer insulating film to a recovery gas containing a methyl group ($—CH_3$) in a second surface treatment process, and then forming an etch stop layer on the metal wiring region and the first interlayer insulating film.

18 Claims, 21 Drawing Sheets

(56) References Cited

U.S. PATENT DOCUMENTS

| | | |
|---|---|---|
| 7,229,921 B2 | 6/2007 | Hironaga et al. |
| 7,282,434 B2 | 10/2007 | Tamaru et al. |
| 7,323,760 B2 | 1/2008 | Sake |
| 7,329,591 B2 | 2/2008 | Liu et al. |
| 7,354,855 B2 | 4/2008 | Hotta et al. |
| 7,419,901 B2 | 9/2008 | Hotta et al. |
| 7,432,545 B2 | 10/2008 | Ohkubo et al. |
| 7,465,670 B2 | 12/2008 | Hirotsu et al. |
| 7,531,891 B2 | 5/2009 | Ohto et al. |
| 7,557,034 B2 | 7/2009 | Hotta et al. |
| 7,557,447 B2 | 7/2009 | Usami et al. |
| 7,569,498 B2 | 8/2009 | Masuda et al. |
| 7,579,266 B2 | 8/2009 | Sakoh |
| 7,598,154 B2 | 10/2009 | Izumi |
| 7,602,040 B2 | 10/2009 | Hotta et al. |
| 7,604,834 B2 | 10/2009 | Ravi |
| 7,612,453 B2 | 11/2009 | Usami |
| 7,615,498 B2 | 11/2009 | Sasaki et al. |
| 7,629,251 B2 | 12/2009 | Hotta et al. |
| 7,649,258 B2 | 1/2010 | Usami et al. |
| 7,678,641 B2 | 3/2010 | Mori et al. |
| 7,701,060 B2 | 4/2010 | Tada et al. |
| 7,723,849 B2 | 5/2010 | Ohmori et al. |
| 7,741,228 B2 | 6/2010 | Ueki et al. |
| 7,745,905 B2 | 6/2010 | Iwamoto et al. |
| 7,755,191 B2 | 7/2010 | Furuya |
| 7,795,142 B2 | 9/2010 | Masuda et al. |
| 7,795,733 B2 | 9/2010 | Tsumura et al. |
| 7,799,693 B2 | 9/2010 | Soda |
| 7,803,705 B2 | 9/2010 | Kobayashi et al. |
| 7,830,013 B2 | 11/2010 | Kon et al. |
| 7,897,205 B2 | 3/2011 | Kameshima et al. |
| 7,906,848 B2 | 3/2011 | Kumagai et al. |
| 7,923,297 B2 | 4/2011 | Izumi |
| 7,932,606 B2 | 4/2011 | Hotta et al. |
| 7,936,068 B2 | 5/2011 | Usami |
| 7,968,966 B2 | 6/2011 | Hotta et al. |
| 8,003,527 B2 | 8/2011 | Sunayama et al. |
| 8,008,730 B2 | 8/2011 | Fukui et al. |
| 8,012,871 B2 | 9/2011 | Ohmori et al. |
| 8,053,369 B2 | 11/2011 | Takase |
| 8,075,730 B2 | 12/2011 | Shimura et al. |
| 8,080,878 B2 | 12/2011 | Ueki et al. |
| 8,188,600 B2 | 5/2012 | Amano et al. |
| 8,203,210 B2 | 6/2012 | Furusawa et al. |
| 8,236,681 B2 | 8/2012 | Nagano |
| 8,242,015 B2 | 8/2012 | Matsumoto et al. |
| 8,247,321 B2 | 8/2012 | Matsumoto et al. |
| 8,269,309 B2 | 9/2012 | Hotta et al. |
| 8,278,205 B2 | 10/2012 | Matsuoka |
| 8,338,290 B2 | 12/2012 | Morinaga |
| RE43,909 E | 1/2013 | Koike |
| 8,358,007 B2 | 1/2013 | Sohn et al. |
| 8,404,595 B2 | 3/2013 | Honda et al. |
| 8,431,480 B2 | 4/2013 | Noguchi et al. |
| 8,435,882 B2 | 5/2013 | Matsuoka et al. |
| 8,440,563 B2 | 5/2013 | Matsumoto et al. |
| 8,470,706 B2 | 6/2013 | Arnold et al. |
| 8,481,430 B2 | 7/2013 | Sato |
| 8,487,412 B2 | 7/2013 | Hotta et al. |
| 8,492,287 B2 | 7/2013 | Tahara |
| 8,518,821 B2 | 8/2013 | Hotta et al. |
| 8,558,334 B2 | 10/2013 | Ueki et al. |
| 8,581,415 B2 | 11/2013 | Hotta et al. |
| 8,591,989 B2 | 11/2013 | Chou et al. |
| 8,617,981 B2 | 12/2013 | Noguchi et al. |
| 8,653,665 B2 | 2/2014 | Miyoshi |
| 8,669,185 B2 | 3/2014 | Onizawa et al. |
| 8,686,538 B2 | 4/2014 | Hotta et al. |
| 8,704,373 B2 | 4/2014 | Hotta et al. |
| 8,742,521 B2 | 6/2014 | Ueki et al. |
| 8,753,717 B2 | 6/2014 | Suzuki et al. |
| 8,778,793 B2 | 7/2014 | Furuhashi et al. |
| 8,810,034 B2 | 8/2014 | Noguchi et al. |
| 8,829,604 B2 | 9/2014 | Okaji |
| 8,841,545 B2 | 9/2014 | Wakayama et al. |
| 8,865,590 B2 | 10/2014 | Matsumoto et al. |
| 8,993,440 B2 | 3/2015 | Masuda et al. |
| 8,993,460 B2 | 3/2015 | LaVoie |
| 9,053,961 B2 | 6/2015 | Kaneko et al. |
| 9,064,870 B2 | 6/2015 | Noguchi et al. |
| 9,123,532 B2 | 9/2015 | Chan et al. |
| 9,153,482 B2 | 10/2015 | Knisley et al. |
| 9,245,789 B2 | 1/2016 | Okamoto et al. |
| 9,266,146 B2 | 2/2016 | Matsumoto et al. |
| 2006/0040490 A1* | 2/2006 | Chen ................ C23C 16/0245 438/629 |
| 2006/0148255 A1* | 7/2006 | Lu .................. H01L 21/02074 438/687 |
| 2006/0261483 A1 | 11/2006 | Tsumura et al. |
| 2015/0179582 A1* | 6/2015 | Baek ................ H01L 23/53238 257/751 |

* cited by examiner

METHODS FOR FABRICATING SEMICONDUCTOR DEVICES INCLUDING SURFACE TREATMENT PROCESSES

REFERENCE TO PRIORITY APPLICATION

This application claims priority under 35 U.S.C. § 119 to Korean Patent Application No. 10-2016-0131088, filed Oct. 11, 2016 in the Korean Intellectual Property Office, the contents of which are hereby incorporated herein by reference in their entirety.

BACKGROUND

1. Technical field

Embodiments of the inventive concepts relate to methods for fabricating semiconductor devices, and more specifically, to methods for fabricating semiconductor devices using a low-k material as an interlayer insulating film.

2. Description of the Related Art

In fabrication of semiconductor devices, dielectric constant k of a dielectric film may decrease as the semiconductor devices are continuously scaled. Minimizing integration damage for low-k dielectric films may therefore be useful when decreasing a feature size.

Accordingly, it may be useful to improve resistive capacitance and reliability of the dielectric film when decreasing the feature size.

SUMMARY

Some embodiments of the inventive concepts may provide methods for fabricating semiconductor devices that may provide enhanced performance and reliability by recovering a quality of a low-k insulating film that is damaged by a plasma process.

Some embodiments of the inventive concepts may provide semiconductor devices that may provide enhanced performance and reliability of the device by recovering a quality of a low-k insulating, film that is damaged by a plasma process.

According some embodiments of the inventive concepts, methods for fabricating semiconductor devices may be provided. A method for fabricating a semiconductor device may include forming a first interlayer insulating film having a trench therein on a substrate. The method may include filling at least a portion of the trench with a metal wiring region, exposing a surface of the metal wiring region and a surface of the first interlayer insulating film to a plasma in a first surface treatment process, then exposing the surface of the first interlayer insulating film to a recovery gas containing a methyl group ($—CH_3$) in a second surface treatment process, and then forming an etch stop layer on the metal wiring region and the first interlayer insulating film.

According to some embodiments of the inventive concepts, methods for fabricating a semiconductor device may be provided. A method for fabricating a semiconductor device may include forming an interlayer wiring structure including a metal wiring region and a first interlayer insulating film. An upper surface of the metal wiring region may be exposed. The method may include adsorbing silicon onto the exposed upper surface of the metal wiring region by a first surface treatment process using plasma. The first surface treatment may treat a surface of the metal wiring region and may damage a surface of the first interlayer insulating firm. The method may include, by a second surface treatment process using a recovery gas containing methyl group ($—CH_3$) and plasma, treating the damaged surface of the first interlayer insulating film and, after the first and second surface treatment processes, forming an etch stop layer on the interlayer wiring structure.

According to some embodiments of the inventive concepts, methods for fabricating a semiconductor device may be provided. A method for fabricating a semiconductor device may include forming an insulating film on a substrate and forming a metal wiring region in the insulating film. The method may include exposing a surface of the insulating film and a surface of the metal wiring region to a plasma in a first surface treatment process, then exposing the surface of the insulating film to a recovery gas in a second surface treatment, and then forming an etch stop layer on the metal wiring region and the insulating film. The recovery gas may increase a carbon concentration of the surface of the insulating film.

BRIEF DESCRIPTION OF THE DRAWINGS

The inventive concepts will become more clearly understood in view of the detailed description and the accompanying drawings.

DETAILED DESCRIPTION

Figure 1:
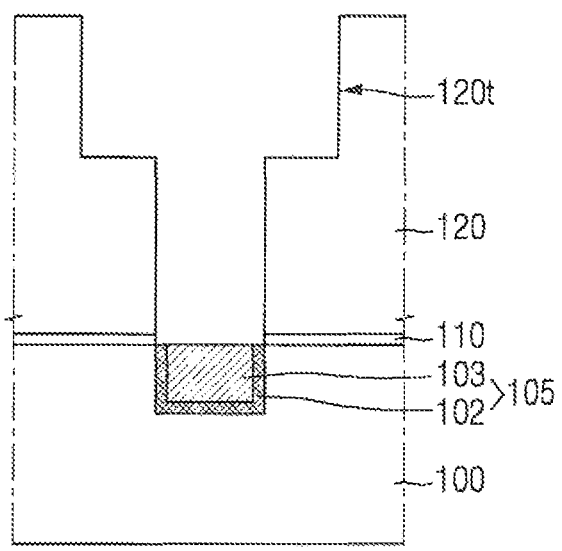
FIGS. 1 to 3 are cross-sectional views illustrating intermediate stages in methods of fabricating semiconductor devices according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein, Rather, these embodiments are provided so that this disclosure will be thorough and complete, and will fully convey the scope of the inventive concepts to those skilled in the art.

The drawings are intended to illustrate the general characteristics of methods, structures and/or materials utilized in certain some embodiments and to supplement the written description provided below. These drawings may not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated, listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

FIGS. 1, 2, 3, 5, and 7 are cross-sectional views illustrating intermediate stages in methods of fabricating semiconductor devices according to sonic embodiments of the inventive concepts. FIGS. 4A and 4B are cross-sectional views conceptually illustrating sections P and Q of FIG. 3, respectively. FIG. 6A is a cross-sectional view conceptually illustrating section P of FIG. 4. FIG. 6B is a graph illustrating carbon concentration according to a depth of the first lower interlayer insulating film of FIGS. 3 and 5. FIG. 8 is a schematic block diaizram illustrating a chamber of equipment in which a first surface treatment process, a second surface process, and a process of forming an upper etch stop layer may be performed according to some embodiments of the inventive concepts.

Referring to FIG. 1, a first lower etch stop layer 110 and a first lower inter layer insulating film 120 may be formed on a substrate 100 that includes a lower pattern 105.

The first lower interlayer insulating film 120 may include a first trench 120t. The first trench 120t may expose a lower pattern 105. The first trench 120t may extend down through the first lower interlayer insulating film 120 and the first lower etch stop layer 110.

Specifically, the lower pattern 105 may be formed in the substrate 100. In some embodiments, the substrate 100 may be a stack structure of a base substrate and an epitaxial layer, but embodiments are not limited thereto. In some embodiments, the substrate 100 may be a silicon substrate, a gallium arsenide substrate, a silicon germanium substrate, a ceramic substrate, a quartz substrate, or a glass substrate for display or may be a semiconductor on insulator (SOI) substrate or silicon germanium on insulator (SGOI). Hereinbelow, a silicon substrate will be described as an example. Further, the first lower interlayer insulating film 120, and so on, may be formed on the silicon substrate 100.

In methods for fabricating semiconductor devices, according to some embodiments, the lower pattern 105 may be described as a metal wiring. However, this is provided only for the sake of convenience in explanation, and embodiments are not limited thereto. That is, in some embodiments, the lower pattern 105 may be a transistor, diode, and so on formed in the substrate 100 and, specifically, may be a gate electrode of a transistor or a source/drain of a transistor.

The lower pattern 105 included in the substrate 100 may include a conductive material. The lower pattern 105 may include a lower barrier film 102 and a lower wiring film 103

The lower wiring film 103 may include, for example, aluminum (Al), copper (Cu), tungsten (W), cobalt (Co), or a combination thereof.

The lower barrier film 102 may be formed between the lower wiring film 103 and the substrate 100. The lower barrier film 102 may be formed along a recess in the substrate 100, for example. The lower barrier film 102 may include a material such as, for example, tantalum (Ta), tantalum nitride (TaN), titanium (Ti), titanium nitride (TiN), ruthenium (Ru), cobalt (Co), nickel (Ni), nickel boron (NiB), tungsten nitride (WN), zirconium (Zr), zirconium nitride (ZrN), vanadium (V), vanadium nitride (VN), niobium (Nb), niobium nitride (NbN), and so on. While the lower barrier film 102 is illustrated as a single layer, in some embodiments it may include a plurality of layers.

In some embodiments, a lower capping conductive film extending along, an upper surface of the lower wiring film 103 may further be formed.

The first lower etch stop layer 110 may be formed on the substrate 100. The first lower etch stop layer 110 may be a capping film that protects the lower pattern 105. For example, the first lower etch stop layer 110 may include at least one of silicon nitride (SiN) and/or silicon carbonitride (SiCN). The first lower etch stop layer 110 may be formed by, for example, chemical vapor deposition (CVD), atomic layer deposition, or the like. Hereinbelow, by way of example, the first lower etch stop layer 110 may be described as including silicon carbonitride (SCN).

The first lower interlayer insulating film 120 may be formed on the first lower etch stop layer 110. The first lower interlayer insulating film 120 may include at least one of silicon oxide, silicon nitride, silicon oxynitride, and/or a low-k material, for example.

For example, the first lower interlayer insulating film 120 may include a low-k material to reduce a coupling phenomenon between the wirings. The low-k material may be silicon oxide having suitably high carbon and hydrogen, for example, and may be a material such as SiCOH.

When carbon is included in the insulating material, the dielectric constant of the insulating material may be low. However, in some embodiments, in order to lower the dielectric constant of the insulating material, the insulating material may include pores such as cavities filled with gas, or air in the insulating material.

For example, the low-k material may include fluorinated tetraethylorthositicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DAIDBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but embodiments are not limited thereto.

In methods for fabricating semiconductor devices according to some embodiments, the first lower interlayer insulating film 120 may include a low-k material.

The first lower interlayer insulating film 120 may be, formed by, for example, chemical vapor deposition (CVD), spin coating, plasma enhanced CVD (PECVD), high density plasma CVD (HDP-CVD), and so on.

A mask pattern may be formed on the first lower interlayer insulating film 120. A first trench 120t may be formed in the first lower interlayer insulating film 120 by etching the first lower interlayer insulating film 120 and the first lower etch stop layer 110 with the mask pattern.

Figure 2:
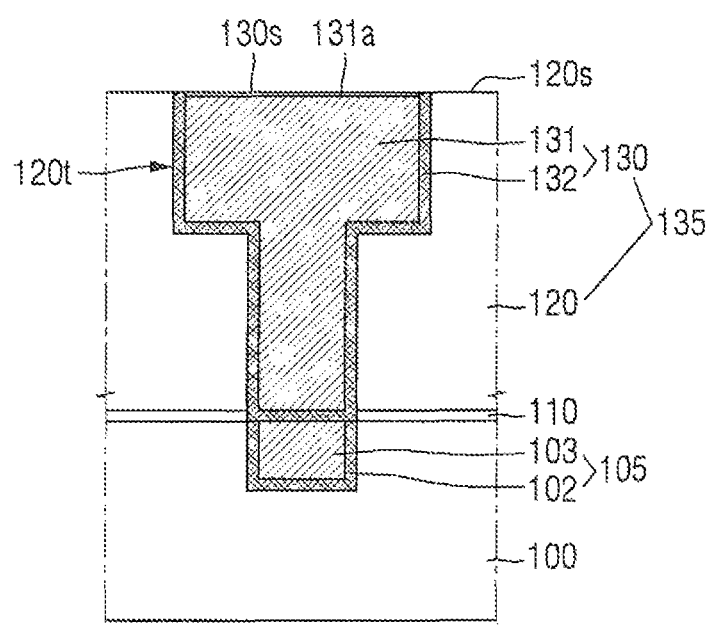

Referring to FIG. 2, a first metal wiring 130 may be formed on the exposed lower pattern 105. The first metal wiring 130 may fill the first trench 120t. The first metal wiring 130 formed in the first trench 120t may be in contact with the lower pattern 105 to be electrically connected.

As a result, a first interlayer wiring structure 135 including the first metal wiring 130 and the first lower interlayer insulating film 120 may be formed on the substrate 100. In the first interlayer wiring structure 135, an upper surface 130s of the, first metal wiring may be exposed.

The first metal wiring 130 may include a first barrier film 132 and a first metal pattern 131. The first barrier film 132 may be formed along a sidewall and a bottom surface of the first trench 120t.

The first metal pattern 131 may be formed on the first barrier film 132. The first metal pattern 131 may be tarred by filling the rest of the first trench 120t which remains after the first barrier film 132 is formed.

The first metal wiring 130 may include a first metal oxide film 131a formed on the upper surface 130s of the first metal wiring, that is, on a surface of the first metal wiring 130. For example, the first metal oxide film 131a may be formed on an upper surface of the first metal pattern 131. The first metal pattern 131 may include the first metal, oxide film 131a. The upper surface 130s of the first metal wiring may include an upper surface of the first metal oxide film 131a and an uppermost surface of the first barrier film 132.

The first metal oxide film 131a may include an oxide of a metal included in the first metal, pattern 131, for example.

FIG. 2 illustrates the first metal oxide film 131a formed only on the upper surface of the first metal pattern 131, but embodiments are not limited thereto, The first metal oxide film 131a may be also formed on the exposed surface of the first barrier film 132. In such case, the first metal oxide film 131a formed on the exposed surface of the first barrier film 132 may include an oxide of a metal included in the first barrier film 132.

in methods for fabricating semiconductor devices according to some embodiments, the upper surface 130s of the first metal wiring and, an upper surface 120s of the first lower interlayer insulating film 120 may be coplanar.

For example, the first barrier film 132 may include at least one of tantalum, tantalum nitride, titanium, titanium nitride, ruthenium, cobalt, nickel, nickel boron, tungsten nitride, zirconium, zirconium nitride, vanadium, vanadium nitride, niobium, and/or niobium nitride. The first barrier film 132 may be formed by, for example, chemical vapor deposition, sputtering, or the like.

The first metal pattern 131 may include, for example, aluminum (Al), copper (Cu). tungsten (W), cobalt (Co), and a combination thereof. The first metal pattern 131 may be formed by, for example, chemical vapor deposition, physical vapor deposition, electroplating or the like.

According to some embodiments, the first metal pattern 131 may include copper. For example, copper included in the first metal wiring 130 may include at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), and/or zirconium (Zr).

More specifically, the first barrier film 132 may be formed along the sidewall and the bottom surface of the first trench 120t, and the, upper surface 120s of the first lower interlayer insulating film 120. A metal wiring film is formed on the first barrier film 132, filling the first trench 120t and covering the upper surface 120s of the first lower interlayer insulating film 120.

Then, the first barrier, film 132 and the metal wiring film formed on the upper surface 120s of the first lower interlayer insulating film 120 may be removed to form the first metal wiring 130 filling the first trench 120t. The first metal wiring 130 may be formed in the first lower interlayer insulating film 120.

The first barrier film 132 and the metal wiring film formed on the, upper surface 120s of the first lower interlayer insulating film 120 may be removed using a planarization process such as chemical mechanical polishing (CMP).

As a result, the upper surface 130s of the first metal wiring and the upper surface 120s of the first lower interlayer insulating film 120 may be on the same plane. That is, the upper surface of the first metal pattern 131 may be on, the same plane as the upper surface 120s of the first lower interlayer insulating film 120.

Meanwhile, since the CMP process may be performed using chemicals, and the first metal wiring 130 may be exposed to air in order to move to a subsequent process, the first metal oxide film 131a may be formed on the upper surface 130s of the first metal wiring.

In a method for fabricating a semiconductor device according to some embodiments, since the first metal pattern 131 may include copper, the first metal oxide film 131a may include copper, oxide.

Although FIG. 2 illustrates the first lower interlayer insulating film 120 without a damaged region caused by the CMP process and so on, embodiments are not limited thereto. This will be described with reference to FIGS. 3 and 4A.

Figure 3:
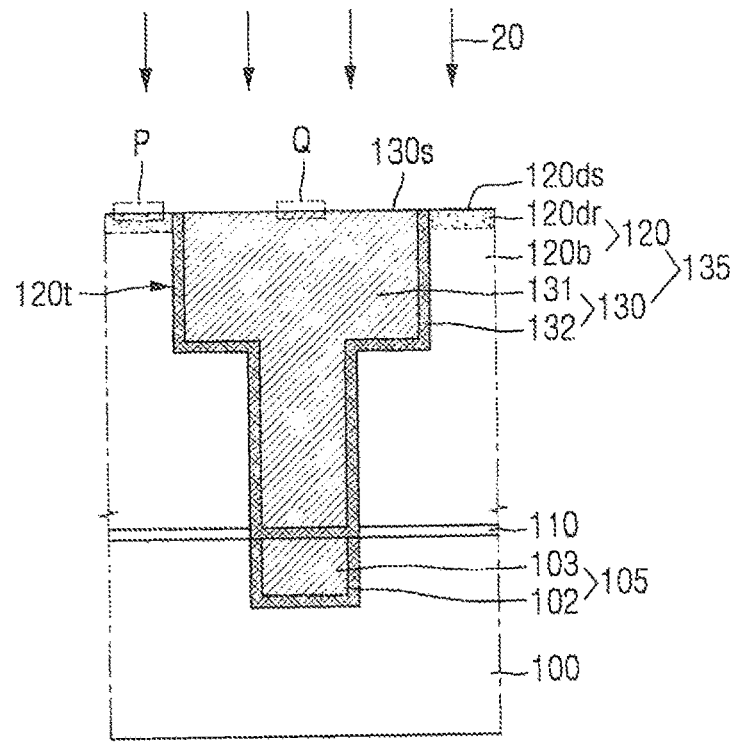
Figure 4A:
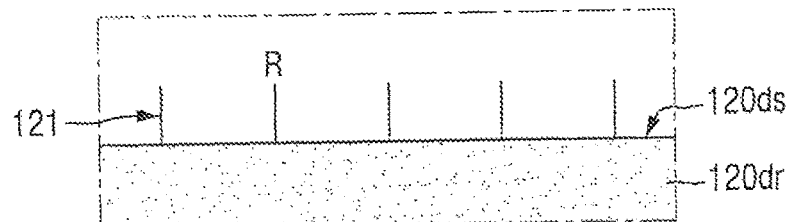
FIGS. 4A and 4B are cross-sectional views conceptually illustrating sections P and Q of FIG. 3, respectively.
Figure 4B:
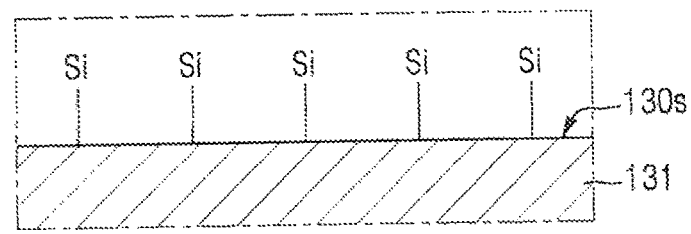

Referring to FIGS. 3 to 4B, by a first surface treatment process 20 using plasma, the surface of the first metal wiring 130 may be surface-treated.

The first, surface treatment process 20 may reduce the first metal oxide film 131a formed on the surface of the first metal wiring 130. The first metal oxide film 131a formed on the exposed surface of the first metal wiring 130 may be reduced. That is, a metal oxide included in the first metal oxide film 131a may be reduced to metal. For example, copper oxide included in the first metal oxide film 131a may be reduced to copper.

The first metal oxide film 131a may be reduced and removed, so that a metal of the metal oxide included in the first metal oxide film 131a may be included in the first metal pattern 131.

The first metal oxide film 131a may be removed by the first surface treatment process 20, so that the upper surface 130s of the first metal wiring may include the upper surface of the first metal pattern 131 and the uppermost surface of the first barrier film 132.

Further, the first surface treatment process 20 may adsorb silicon onto the surface of the first metal wiring 130, that is, onto the upper surface 130s of the first metal wiring. By the first surface treatment process 20, silicon may be adsorbed onto the exposed upper surface 130s of the first metal wiring.

By adsorbing silicon onto the surface of the first metal wiring 130, adhesive strength may be enhanced between the first metal wiring 130 and a film formed on the first metal wiring 130.

FIG. 4B illustrates silicon adsorbed onto the upper surface 130s of the first metal wiring. Silicon adsorbed onto the upper surface 130s of the first metal wiring may form a bond with metal atoms contained in the first metal pattern 131.

The first surface treatment process 20 may use a gas capable of supplying silicon to the upper surface 130s of the first metal wiring, and a gas for reducing the first metal oxide film 131a.

For example, the gas capable of supplying silicon to the upper surface 130s of the first metal wiring may include silane ($Si_nH_{2n+2}$), and the gas for reducing the first metal oxide film 131a may include ammonia ($NH_3$). The gas capable of supplying silicon may include, for example, monosilane ($SiH_4$), but embodiments are not limited thereto.

For example, the first surface treatment process 20 may surface-treat the surface of the first metal wiring 130 using ammonia, a process gas containing monosilane, and plasma.

In some embodiments, during the first surface treatment process 20, the first lower interlayer insulating film 120 exposed to the plasma can be damaged by the plasma.

As a result, a first damaged region 120dr may be formed on an upper portion of the first lower interlayer insulating film 120. Accordingly, the first lower interlayer insulating film 120 may include a damaged upper surface 120ds of the first lower interlayer insulating film 120.

The first lower interlayer insulating film 120 may include the first damaged region 120dr, and a first non-damaged region 120b located underneath the, first damaged region 120dr, The first non-damaged region 120b may refer to a region that is not damaged by the plasma of the first surface treatment process 20.

When the first lower interlayer insulating film 120 is exposed to stages of fabrication of a semiconductor device, such as a chemical mechanical polishing (CMP) process, a planarization process, or a process using a plasma, such process may damage bonding structures of the first lower interlayer insulating film 120.

For example, by the first surface treatment process 20, a surface of the first lower interlayer insulating film 120 may be changed from hydrophobic to hydrophilic. If an upper film is formed on the hydrophilic first lower interlayer insulating film 120 without a recovery process, a metal included in the first metal wiring 130 may be piled up at the boundary between the first lower interlayer insulating film 120 and the upper film. Such piled-up metal may be a bridge to electrically connect adjacent metal wirings, thus degrading the reliability of a semiconductor device.

FIG. 4A shows the first damaged region 120dr and the damaged upper surface 120ds of first lower interlayer insulating film 120. In the damaged upper surface 120ds of the first lower interlayer insulating film 120, dangling bonds 121, which are not bonded with other elements, may be exposed. Alternatively, in the damaged upper surface 120ds of the first lower interlayer insulating film 120, a functional group R with the good reactivity or hydrophilicity may be bonded with atoms included in the first damaged region 120dr.

For example, the first surface treatment process 20 may adsorb silicon onto the surface of the first metal wiring 130 after reducing the first metal oxide film 131a formed on the surface of the first metal wiring 130, but embodiments are not limited thereto.

Figure 5:
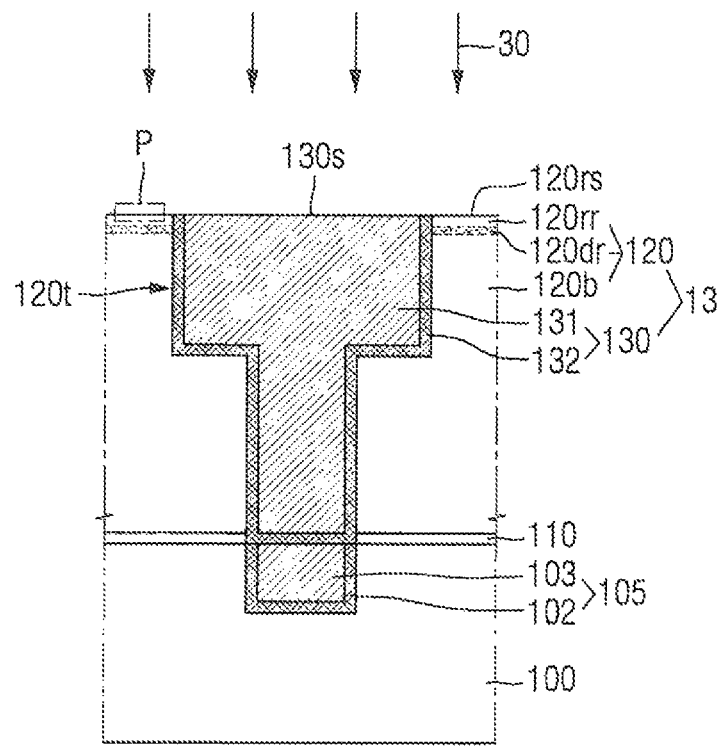
FIG. 5 is a cross-sectional view illustrating an intermediate stage in methods of fabricating semiconductor devices according to some embodiments of the inventive concepts.
Figure 6A:
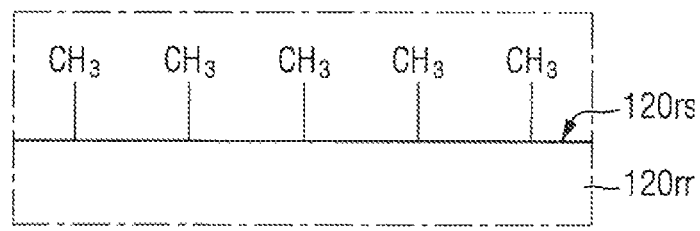
FIG. 6A is a cross-sectional view conceptually illustrating section P of FIG. 4.
Figure 6B:
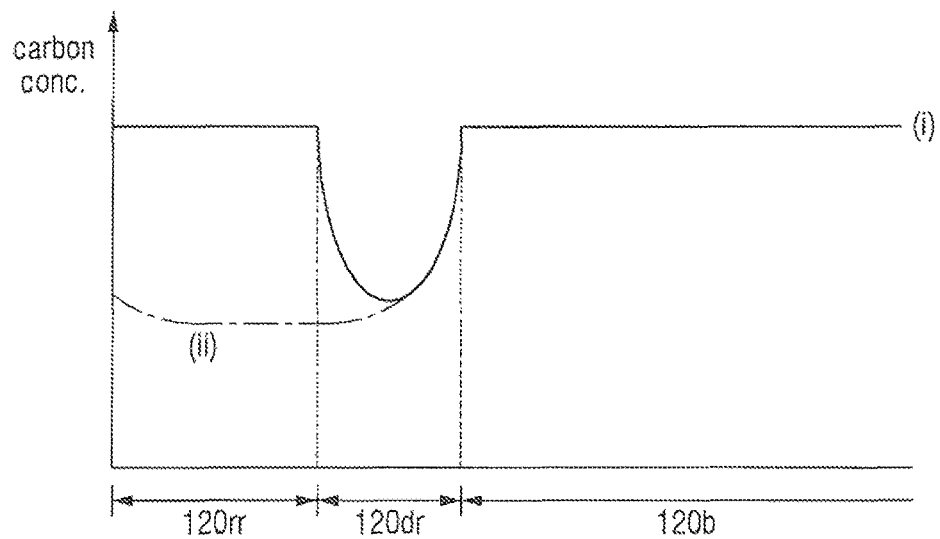
FIG. 6B is a graph illustrating carbon concentration according to a depth of the first lower interlayer insulating film of FIGS. 3 and 5.

Referring to FIGS. 5 to 6B, by a second surface treatment process 30, the damaged surface of the first lower interlayer insulating film 120 may be surface-treated. The second surface treatment process 30 may surface-treat a surface of the first lower interlayer insulating film 120 damaged by the first surface treatment process 20.

The second surface treatment process 30 may recover at least a portion of the damaged first lower interlayer insulating film 120. More specifically, the second surface treatment process 30 can improve or cure at least a portion of the first damaged region 120dr.

The second surface treatment process 30 may change at least the portion of the first damaged region 120dr to a first recovery region 120rr. Accordingly, the first lower interlayer insulating film 120 may include a recovered upper surface 120rs of the first lower interlayer insulating film 120.

The first lower interlayer insulating film 120 may include the first recovery region 120rr, the first damaged region 120dr located underneath the first recovery region 120rr, and the first non-damaged region 120b located underneath the first damaged region 120dr. The first recovery region 120rr may be a recovered region by the second surface treatment process 30 of the first damaged region 120dr damaged by the plasma of the first surface treatment process 20.

The second surface treatment process 30 may be performed by using a recovery gas containing a methyl group (—$CH_3$), and plasma. For example, the recovery gas containing the methyl group (—$CH_3$) may include $Si(CH_3)_4$, but embodiments are not limited thereto.

That is, a recovery gas containing the methyl group (—$CH_3$) may be satisfactory if the gas may supply the methyl group (—$CH_3$) to the first lower interlayer insulating film 120, but may be able to avoid depositing a film on the first lower interlayer insulating film 120 and the first metal wiring 130.

Like the first surface treatment process 20, the second surface treatment process 30 may use plasma, but the first lower interlayer insulating film 120 may be recovered without damage. This may be because the recovery of the first lower interlayer insulating film 120 by a methyl group (—CH₃) separated from the recovery gas may be superior to the damage done to the first lower interlayer insulating film 120 by plasma.

FIG. 6A shows the first recovery region 1207 and the recovered upper surface 120*rs* of the first lower interlayer insulating film 120. In the recovered upper surface 120*rs* of the first lower interlayer insulating film 120, the metal group (—CH₃) separated from the recovery gas may be bonded with atoms included in the first recovery region 120*rr*.

Further, by the bonding of the methyl group (—CH3) to the recovered upper surface 120*rs* of the first lower inter-layer insulating film 120, the upper surface 120*rs* of the first lower inter-layer insulating film may be changed from hydrophilic to hydrophobic. Due to the upper surface 120*rs* of the first interlayer insulating film having hydrophobicity, when an upper film is formed on the first lower interlayer insulating film 120, pile-up of a metal included in the first metal wiring 130 at the boundary between the first lower interlayer insulating film 120 and the upper film may be reduced or prevented. Accordingly, the semiconductor device may have enhanced reliability.

FIG. 6B shows, each of concentrations of carbon according to a depth of the first lower interlayer insulating film 120 after the first surface treatment process 20 and the second surface treatment process 30. Line (i) shows carbon concentration according to the depth of the first lower interlayer insulating film 120 after the second surface treatment process 30, and line (ii) shows carbon concentration according to the depth of the first lower interlayer insulating film 120 after the first surface treatment process 20 and before the second surface treatment process 30. The first damaged region 120*dr* and the first recovery region 120*rr* of FIG. 6B may correspond to the first damaged region 120*dr* of FIG. 3 between the first surface treatment process 20 and the second surface treatment process 30.

Referring to FIG. 6B, in the first recovery region 120*rr*, carbon concentration of line (i) after the second surface treatment process 30 has an increased carbon concentration as compared to the carbon concentration of line (ii) after the first surface treatment process 20 and before the second surface treatment process 30.

The carbon concentration of the first damaged region 120*dr* is less than the carbon concentration of the first recovery region 120*rr* and the carbon concentration of the first non damaged region 120*b* of line (i) after the second surface treatment process 30.

With such recovery of the bonding structure in the vicinity of the surface of the first lower interlayer insulating film 120, the characteristics such as breakdown voltage, the leakage current, and so on of the semiconductor device may be improved, As illustrated in FIG. 5, the first damaged region 120*dr* may remain in a middle of the first lower interlayer insulating film 120, but embodiments are not limited thereto.

Figure 7:
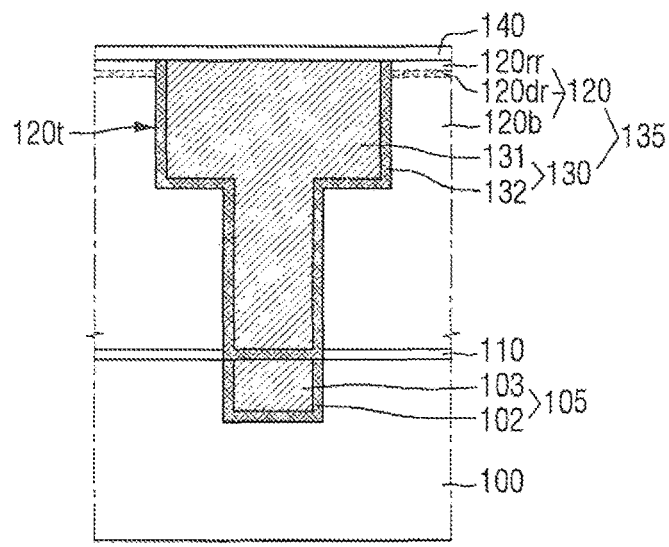
FIG. 7 is a cross-sectional view illustrating an intermediate stage in methods of fabricating semiconductor devices according to some embodiments of the inventive concepts.
Figure 8:
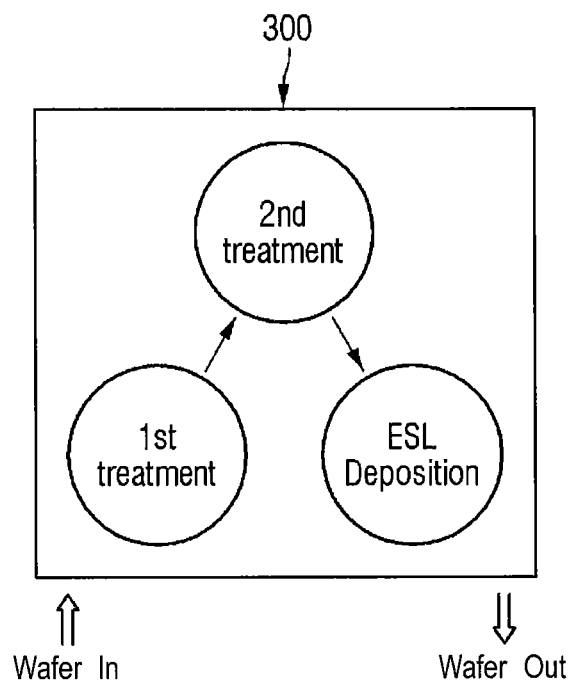
FIG. 8 is a schematic block diagram illustrating a chamber of equipment in which a first surface treatment process, a second surface process, and a process of forming an upper etch stop layer may be performed according to sonic embodiments of the inventive concepts.

Referring to FIG. 7, a first upper etch stop layer 140 may be formed on the first interlayer wiring structure 135.

The first upper etch stop layer 140 may be formed on the first lower interlayer insulating film 120 and the first metal wiring 130. More specifically, the first upper etch stop layer 140 may be formed on the first metal wiring 130 surface-treated by the first surface treatment process 20 and the first lower interlayer insulating film 120 surface-treated by the second surface treatment process 30.

The first upper etch stop layer 140 may be in contact with the first metal wiring 130, and may be in contact with the first lower interlayer insulating film 120. The first upper etch stop layer 140 may be in contact with the first recovery region 120*rr* of the first lower interlayer insulating film 120.

For example, the first upper etch stop layer 140 may include at least one of silicon nitride (SiC) and/or silicon carbonitride (SiCN). The first upper etch stop, layer 140 may be formed using a gas for supplying silicon and a gas for supplying nitrogen.

Referring to FIG. 8, description will be given of the first surface treatment process 20, the second surface treatment process 30, and a process of forming the first upper etch stop layer 140 according to some embodiments of the inventive concepts.

Referring to FIG. 8, a wafer may be loaded into a chamber 300. After the wafer is loaded into the chamber 300, a first treatment for the wafer may be performed. The first treatment may be, for example, the first surface treatment process 20 described above with respect to FIG. 3.

After the first treatment is performed, a second treatment for the wafer may be performed. The second treatment may be, for example, the second surface treatment process 30 described above with respect to FIG. 5.

Then, an etch stop layer (ESL) deposition may be performed for the wafer that has underwent the second treatment. The ESE, deposition may be, for example, a process for forming the first upper etch stop layer 140 described above with respect to FIG. 7.

After the ESL deposition has been performed, the wafer may be unloaded from the chamber 300.

In methods for fabricating semiconductor devices according to some embodiments, the first surface treatment process 20, the second surface treatment process 30, and the process, for forming the first upper etch stop layer 140 may be performed in-situ in one chamber 300.

In other words, the first surface treatment process 20, the second surface treatment process 30, and the process for forming the first upper etch stop layer 140 may be consecutively performed in the same chamber 300.

After removing the first metal oxide film 131*a* formed on the surface of the first metal wiring 130, since the first upper etch stop layer 140 is formed in-situ in the same chamber, the first metal wiring 130 may not be exposed to air.

As a result, it may be possible to reduce or prevent an oxide film from forming on the surface of the first metal wiring 130, and it may be possible to reduce or prevent the first lower interlayer insulating film 120 from being damaged in, the oxide film removing process.

In addition, after the first surface treatment process 20 and the second surface treatment process 30 are performed, when the first upper etch stop layer 140 is formed in-situ, it may be possible to reduce or prevent the reliability problems that may occur on the boundary surface of the first lower interlayer insulating film 120 and the first upper etch stop layer 140.

Figure 9:
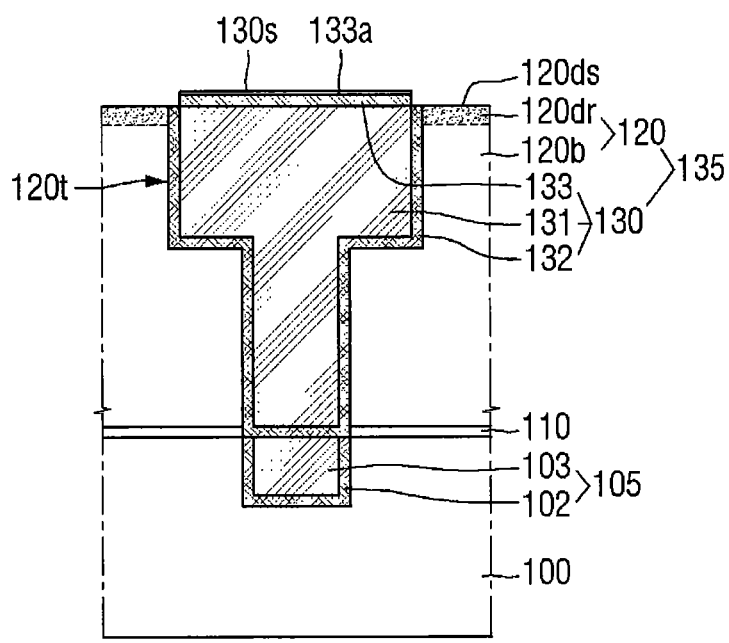
FIG. 9 is a cross-sectional view illustrating an intermediate stage in methods of fabricating semiconductor devices according to some embodiments of the inventive concepts.

FIG. 9 is a cross-sectional view illustrating an intermediate stage in methods of fabricating semiconductor devices according to some embodiments of the inventive concepts.

FIG. 9 may illustrate a process performed, for example, after FIG. 2.

Referring to FIGS. 2 and 9, the first metal oxide film 131*a* formed on the surface of the first metal pattern 131 may be reduced to remove the first metal oxide film 131*a*.

For example, the first metal oxide film 131*a* may be removed using an ammonia gas and plasma.

During removal of the first metal, oxide film 131*a*, the first lower interlayer insulating film 120 exposed to the plasma can be damaged. As a result, the first damaged region 120*dr* may be formed on the upper portion of the first lower interlayer insulating film 120.

After reduction of the first metal oxide film 131*a*, a first capping conductive pattern 133 extending along the upper surface of the first metal pattern 131 may be formed. The first capping conductive pattern 133 may not be deposited on the damaged upper surface 120*ds* of the first lower interlayer insulating film 120, and may be selectively deposited on the first metal pattern 131.

As illustrated in FIG. 9, the first capping conductive pattern 133 may not be deposited on the uppermost surface of the first barrier film 132, but embodiments are not limited thereto.

For example, the first capping conductive pattern 133 may include at least one of cobalt (Co), tungsten (W), aluminum (Al), tantalum (Ta), titanium (Ti), nickel (Ni), ruthenium (Ru), and/or aluminum nitride (AlN).

The first capping conductive pattern 133 may be formed by, for example, chemical vapor deposition, atomic layer deposition, or the like.

After forming the first capping conductive pattern 133, the first capping conductive pattern 133 may be brought into contact with air, so that a first capping oxide film 133*a* may be formed on the surface of the first capping conductive pattern 133.

The first metal wiring 130 may include the first capping conductive pattern 133, the first barrier film 132 formed in the first lower interlayer insulating film 120, and the first metal pattern 131. Further, the first metal wiring 130 may further include the first capping oxide film 133*a* formed on the upper surface 130*s* of the first metal wiring 130, that is, on the surface of the first metal wiring 130.

The first capping oxide film 133*a* may include, for example, an oxide of a metal included in the first capping conductive pattern 133.

As illustrated in FIG. 9, when the first capping conductive pattern 133 is formed on the first metal pattern 131, the upper surface 130*s* of the first metal wiring 130 may protrude further than the upper surface 120*ds* of the first lower insulating film 120.

Further, the upper surface 130*s* of the first metal wiring 130 may include an upper surface of the first capping oxide film 133*a*.

In methods for fabricating semiconductor devices according to some embodiments, forming the first metal wiring 130 may include forming the first barrier film 132 extending along the sidewall and the bottom surface of the first trench 120*t*, forming the first metal patterns 131 filling the first trench 120*t*, and forming the first capping conductive pattern 133 extending along the upper surface of the first metal pattern 131.

Next, the first surface treatment process 20 of FIG. 3 may be performed. The first surface treatment process 20 may surface treat a surface of the first capping conductive pattern 133, for example. For example, the first surface treatment process 20 may reduce the first capping oxide film 133*a* formed on the surface of the first capping conductive pattern 133, and adsorb silicon onto the surface of the first capping conductive pattern 133.

FIGS. 10 to 17 are cross-sectional views illustrating intermediate stages in methods of fabricating semiconductor devices according to some embodiments of the inventive concepts.

Overlapping description with respect to FIGS. 1 to 9 will be made briefly or omitted for the sake of brevity.

Referring to 10, a second lower etch stop layer 210 and a second lower interlayer insulating film 220 are formed on the substrate 100 including a first region I and a second region II.

The lower patterns 105 may be included in the first region I and the second region II of the substrate 100. The second lower interlayer insulating film 220 may include second trenches 220*t*. The second trenches 220*t* may be included in the second lower interlayer insulating film 220 in the first region I and the second lower interlayer insulating film 220 in the second region Ii.

By the second trenches 220*t*, the lower patterns 105 in the first region I and the lower patterns 105 in the second region II may be exposed.

The second lower etch stop layer 210 may be formed on the substrate 100 in the first region I and the second region II. For example, the second lower etch stop layer 210 may include at least one of silicon nitride (SiC) and/or silicon carbonitride (SiCN).

The second lower interlayer insulating film 220 may be formed on the second lower etch stop layer 210. The second lower interlayer insulating film 220 may also include the first region I and the second region II.

The second lower interlayer insulating film 220 may include a low-k material, for example.

Figure 11:
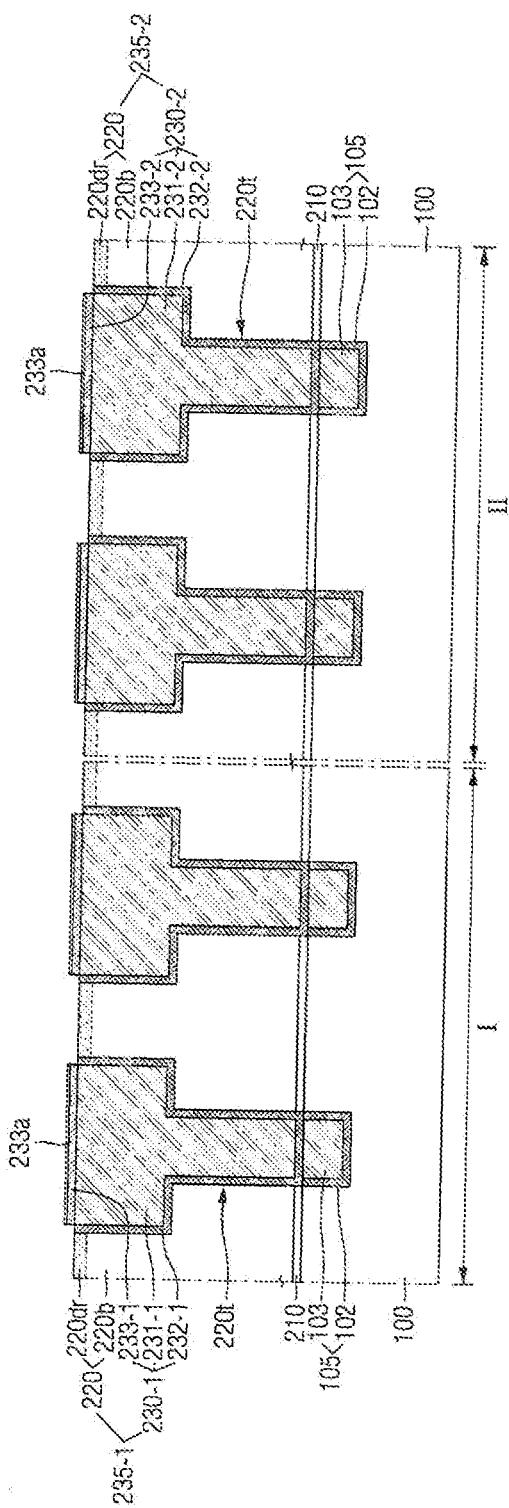

Referring to the FIG. 11, a first region second interlayer wiring structure 235-1 and a second region second interlayer wiring structure 235-2 may be formed on the substrate 100. The first region second interlayer wiring structure 235-1 may be formed in the first region I of the substrate 100 and the second region second interlayer wiring structure 235-2 may be formed in the second region II of the substrate 100. The first region second interlayer wiring structure 235-1 may include first region second metal wirings 230-1 and a first portion of the second lower interlayer insulating film 220. The second region second interlayer wiring structure 235-2 may include second region second metal wirings 230-2 and a second portion of the second tower interlayer insulating film 220. In the first and second region second interlayer wiring structures 235-1 and 235-2, upper surfaces of the first and second region second metal wirings 230-1 and 230-2, respectively, may be exposed.

The first region second metal wirings 230-1 and the second region second metal wirings 230-2 may include respective ones of second barrier films 232-1 and 232-2, second metal patterns 231-1 and 231-2, and second capping conductive patterns 233-1 and 233-2. The second barrier films 232-1 and 232-2 and the second metal patterns 231-1 and 231-2 of the first region second metal wirings 230-1 and the second region second metal wirings 230-2 may be formed in the second lower interlayer insulating film 220.

In addition, the first region second metal wirings 230-1 and the second region second metal wirings 230-2 may each include a second metal oxide film 233*a* formed on respective surfaces of the first region second metal wirings 230-1 and second region second metal wirings 230-2.

The second barrier films 232-1 and 232-2 may extend along a sidewall and a bottom surface of the second trenches 220*t*. The second metal patterns 231-1 and 231-2 may fill the second trenches 220*t* on the second barrier films 232-1 and 232-2. The second capping conductive patterns 233-1 and 233-2 may be formed to extend along upper surfaces of the second metal patterns 231-1 and 231-2.

the second metal oxide films 233*a* may include a metal oxide oxidized from portions of the second capping conductive patterns 233-1 of the first region second metal wirings 230-1 and of the second capping conductive patterns 233-2 of the second region second metal wirings 230-2.

FIG. 11 illustrates the second metal oxide film 233a formed only on upper surfaces of the second capping conductive patterns 233-1 and 233-2, but embodiments are not limited thereto.

For example, the second barrier films 232-1 and 232-2 may include at least one of tantalum, tantalum nitride, titanium, titanium nitride, ruthenium, cobalt, nickel, nickel boron, tungsten nitride, zirconium, zirconium nitride, vanadium, vanadium nitride, niobium, and/or niobium nitride.

The second metal patterns 231-1 and 231-2 may include, for example, aluminum (Al), copper (Cu), tungsten (W), cobalt (Co), or a combination thereof.

For example, the second capping conductive patterns 233-1 and 233-2 may include at least one of cobalt (Co), tungsten (W), aluminum (Al), tantalum (Ta), titanium (Ti), nickel (Ni), ruthenium (Ru), and/or aluminum nitride (AlN).

The second lower interlayer insulating film 220 may include a second damaged region 220dr formed on an upper portion of the second lower interlayer insulating film 220, and a second non-damaged region 220b located underneath the second damaged region 220dr.

More specifically, by using the CMP process, the second barrier films 232-l and 232-2 and second metal patterns 231-1 and 231-2 may be formed in the second trenches 220t.

Since the CMP process may he performed using chemicals, and the second metal patterns 231-1 and 231-2 may be exposed to air in order to move to a subsequent process, the metal oxide films oxidized from the portions of the second metal patterns 231-1 and 231-2 may be formed on the upper surfaces of the second metal patterns 231-1 and 231-2.

Then, the metal oxide films formed on the upper surfaces of the second metal patterns 231-1 and 231-2 may be reduced to remove the metal oxide formed on the upper surfaces of the second metal patterns 231-1 and 231-2.

During removal of the metal oxide on the upper surfaces of the second metal patterns 231-1 and 231-2, the second lower interlayer insulating film 220 exposed to plasma may be damaged. As a result, the second damaged region 220dr may be formed on the upper portion of the second lower interlayer insulating film 220, The second damaged region 220dr may span the first region I and the second region II.

Then, the second capping conductive patterns 233-1 and 233-2 extending along the upper surface of the second metal patterns 231-1, 231-2 may be formed. The second capping conductive patterns 233-1 and 233-2 may not be deposited on the upper surface of the second lower interlayer insulating film 220.

After forming of the second capping conductive patterns 233-1 and 233-2, the second capping conductive patterns 233-1 and 233-2 may be brought into contact with air, so that the second metal oxide films 233a may be formed on the surfaces of the second capping conductive patterns 233-1 and 233-2.

Figure 12:
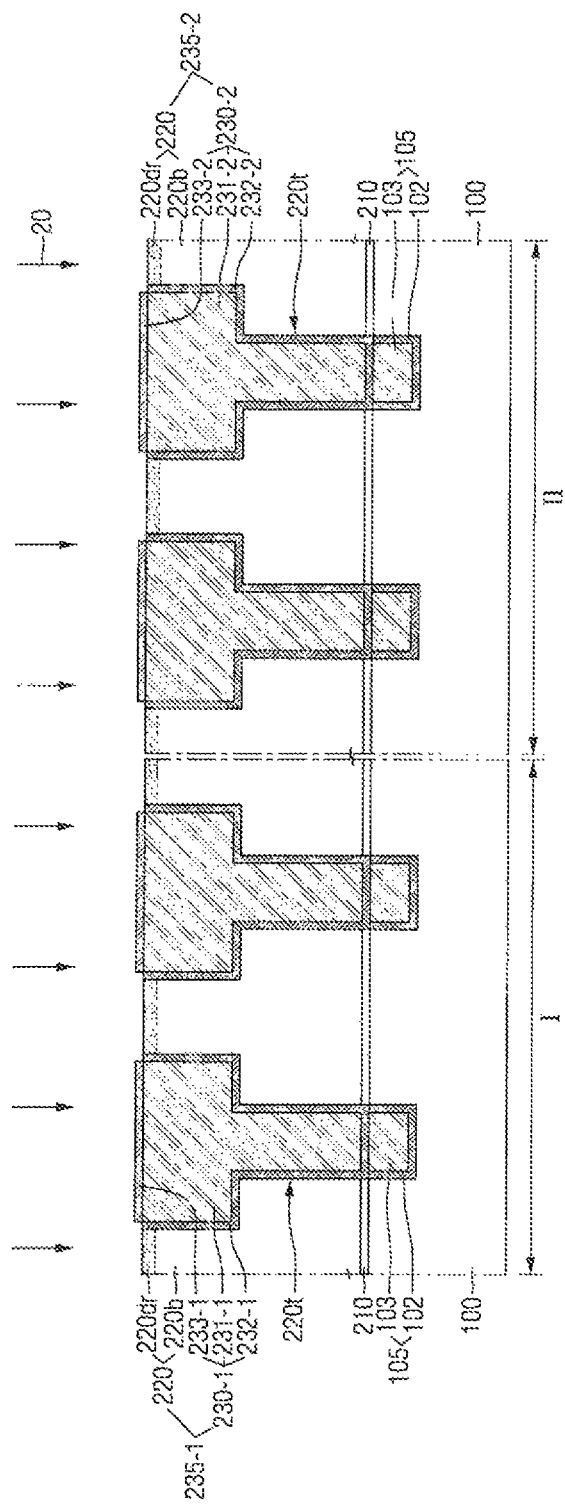

Referring to FIG. 12, by the first surface treatment process 20 using plasma, surfaces of the first region second metal wirings 230-1 and of the second region second metal wirings 230-2 may be surface-treated.

The first surface treatment process 20 may reduce the second metal oxide films 233a formed on the surfaces of the first region second metal wirings 230-1 and the second region second metal wirings 230-2.

Further, the first surface treatment process 20 may adsorb silicon onto the surfaces of the first region second metal wirings 230-1 and the second region second metal wirings 230-2.

During the first surface treatment process 20, the second lower interlayer insulating film 220 exposed to the plasma may be further damaged by the plasma, but embodiments are not limited thereto.

Figure 13:
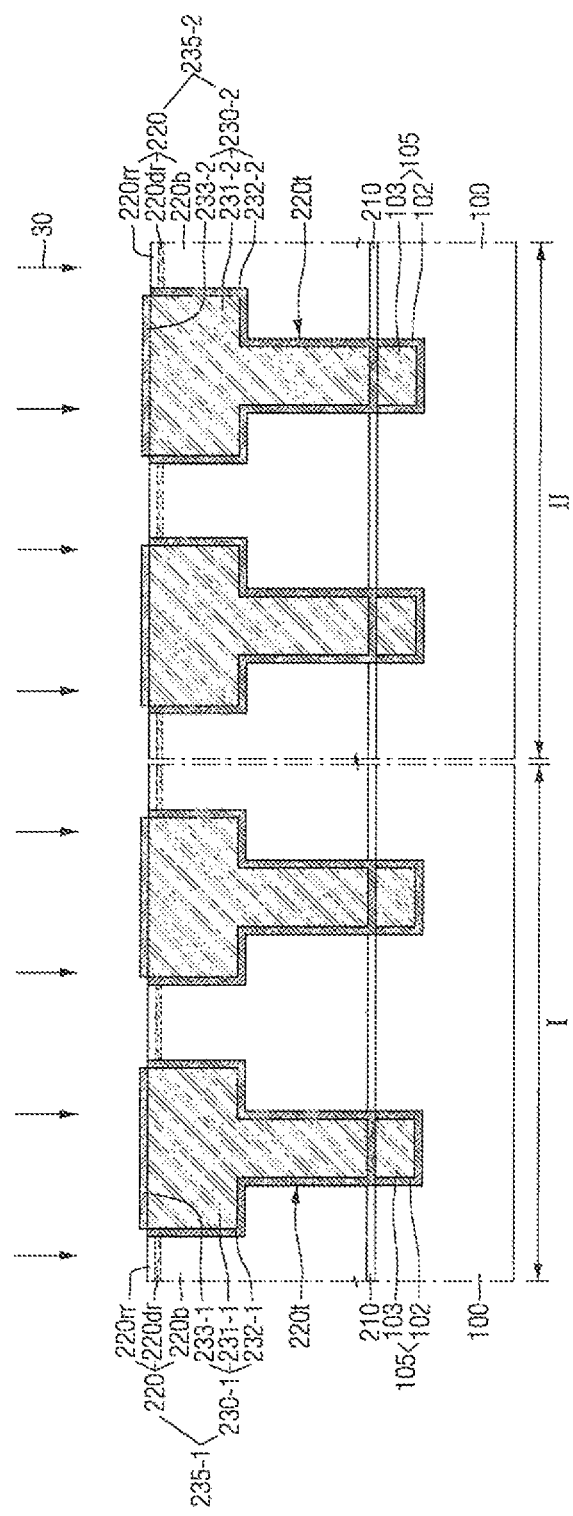

Referring to FIG. 13, by the second surface treatment process 30, the damaged surface of the second lower interlayer insulating film 220 may be surface-treated. The second surface treatment process 30 may surface-treat a surface of the second lower interlayer insulating film 220 damaged by the first surface treatment process 20.

The second surface treatment process 30 may recover at least a portion of the damaged second lower interlayer insulating film 220. More specifically, the second surface treatment process 30 can cure at least a portion of the second damaged region 220dr.

The second surface treatment process 30 may change at least a portion of the second damaged region 220dr to the second recovery region 220rr. Accordingly, the second, lower interlayer insulating film 220 may include the recovered upper surface of the second lower interlayer insulating film 220.

Figure 14:
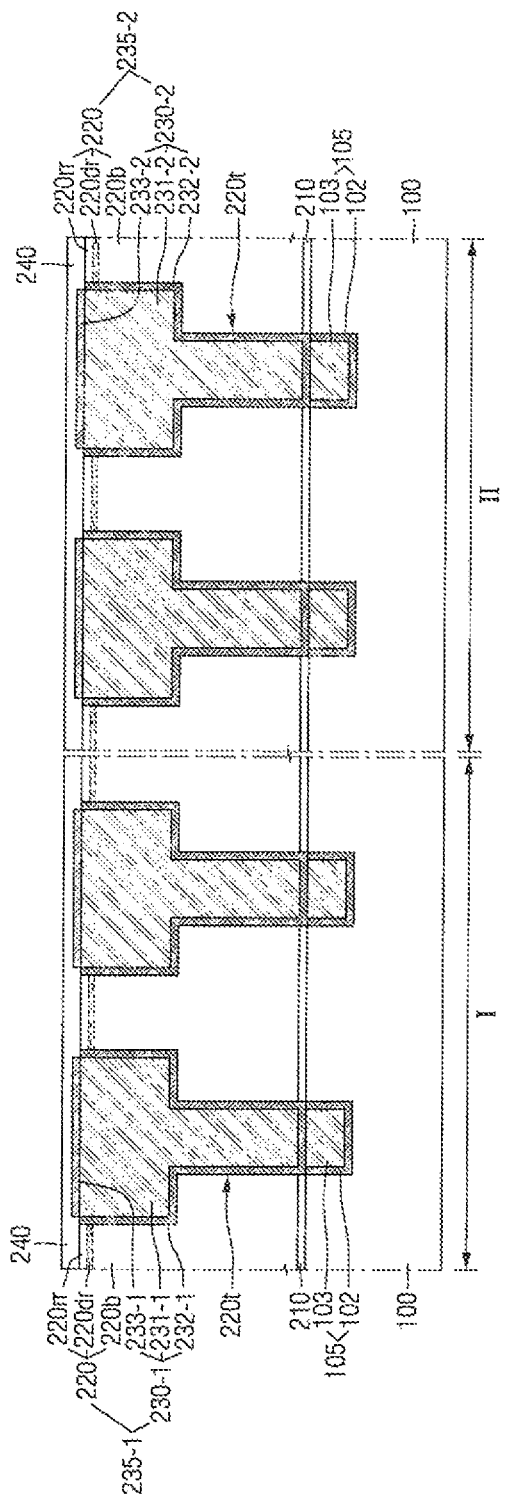

Referring to FIG. 14, a second upper etch stop layer 240 may be formed on the first and second region second interlayer wiring structures 235-1 and 235-2.

The second upper etch stop layer 240 may be in contact with the first region second metal wirings 230-1 and the second region second metal wirings 230-2, and may be in contact with the second lower interlayer insulating film 220. The second upper etch stop layer 240 may be in contact with the second recovery region 220rr of the second, lower interlayer insulating film 220.

For example, the second upper etch stop layer 240 may include at least one of silicon nitride (SiC) and/or silicon carbonitride (SiCN).

In methods for fabricating semiconductor devices according to some embodiments, the first surface treatment process 20, the second surface treatment process 30, and the process for forming the second upper etch stop layer 240 may be performed in-situ in one chamber.

Figure 15:
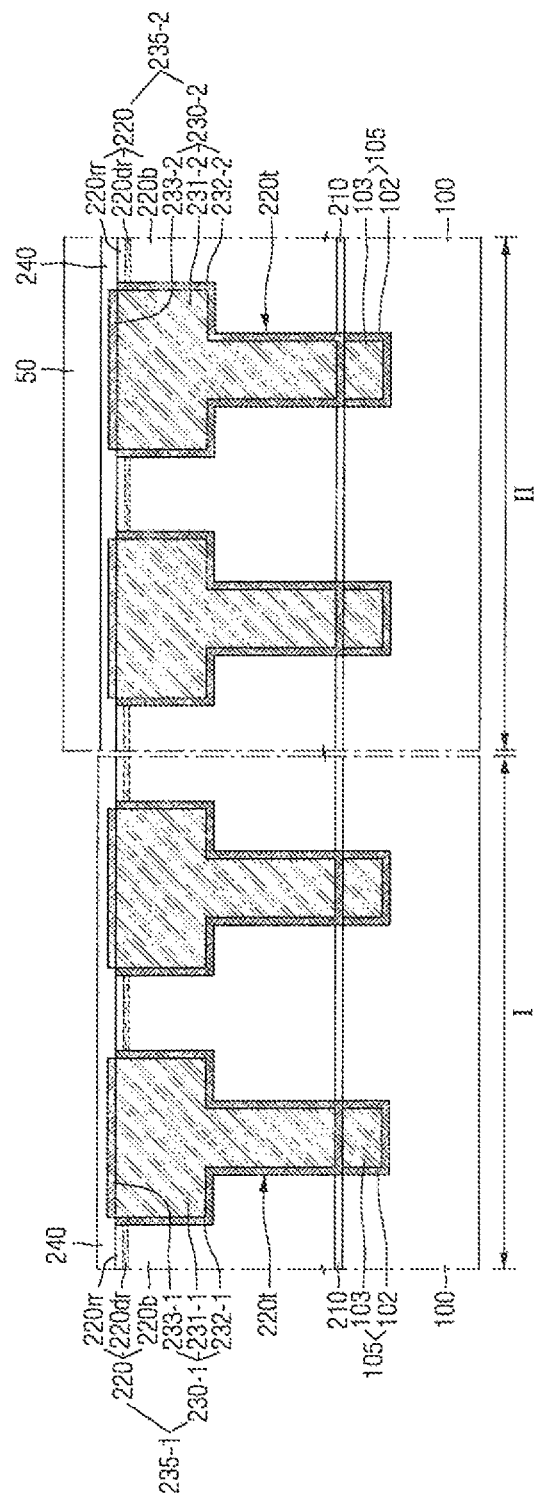

Referring to FIG. 15, a mask pattern 50 may be formed on the second region II of the substrate 100. The mask pattern 50 may be formed on the second upper etch stop layer 240 formed on the second region second interlayer wiring structure 235-2.

As a result, the second upper etch stop layer 240 formed on the first region second interlayer wiring structure 235-1 may be exposed by the mask pattern 50.

Figure 16:
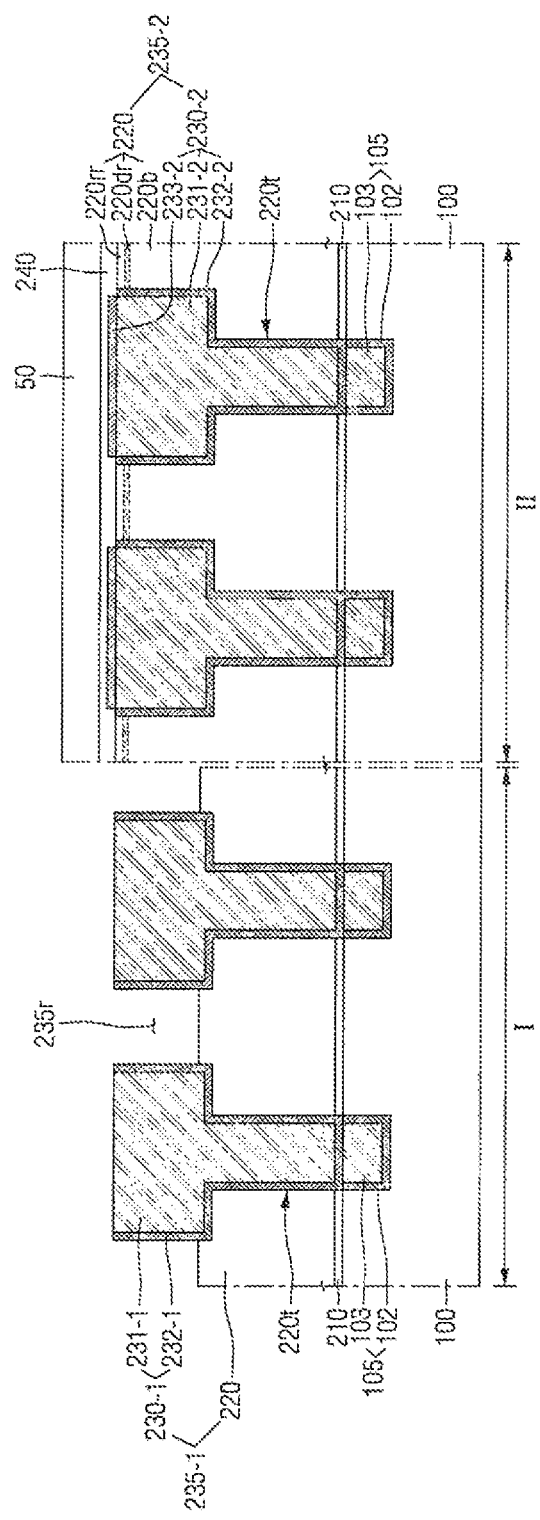

Referring to FIG. 16, using the mask pattern 50, a portion of the second lower interlayer insulating film 220 in the first region I may be removed.

The portion of the second lower interlayer insulating film 220 in the first region I may be removed to form a recess 235r in the first region second interlayer wiring structure 235-1.

The recess 235r may be formed in the first region second interlayer wiring structure 235-1, so that a portion of the first region second metal wirings 230-1 may protrude upward higher than an upper surface of the second lower interlayer insulating film 220 in the first region I.

Further, during forming of the recess 235r, a second damaged region 220dr and a second recovery region 220rr included in the second lower interlayer insulating film 220 in the first region I may be removed.

After forming of the recess 235r, the mask pattern 50 may be removed.

FIG. 16 illustrates that during removal of the portion, of the second lower interlayer insulating film 220 in the first region I, the second capping conductive pattern 233-1 included in the first region second metal wirings 230-1 may be removed, but embodiments are not limited thereto.

Further, FIG. 16 illustrates that the mask pattern 50 on the second region second interlayer wiring structure 235-2 may remain, but embodiments are not limited thereto.

That is, after removing of the second upper etch stop layer 240 formed on the first region second interlayer wiring structure 235-1 using the mask pattern 50, the mask pattern 50 may be removed. Then, using the second upper etch stop layer 240 remained on the second region second interlayer wiring structure 235-2 as a mask, a portion of the second lower interlayer insulating film 220 in the first region I may be removed.

Figure 17:
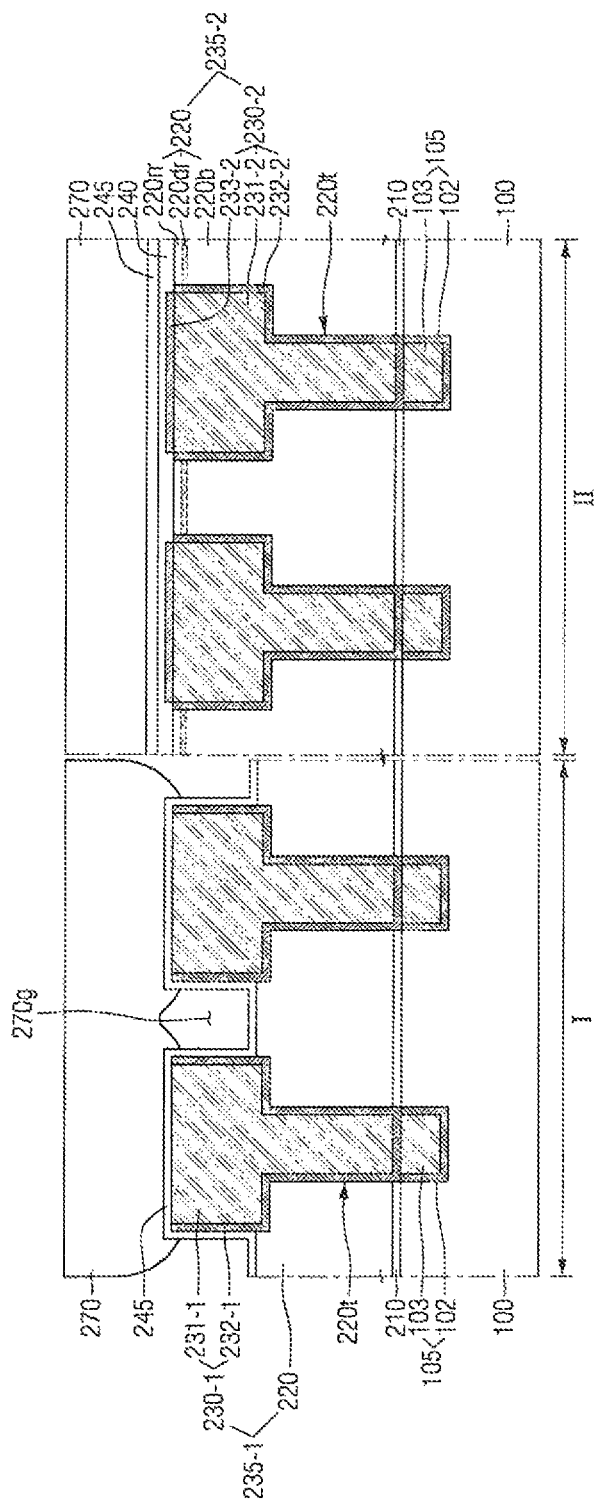

Referring to FIG. 17, a third etch stop layer 245 may be formed along a profile of the protruded first region second metal wirings 230-1, the upper surface of the second lower interlayer insulating film 220 in the first region I, and a profile of the second upper etch stop layer 240 in the second region II.

For example, the third etch stop layer 245 may include at least one of silicon nitride (SiC) and/or silicon carbonitride (SiCN).

A second upper interlayer insulating film 270 may be formed on the third etch stop layer 245. The second upper interlayer insulating film 270 may be formed on the second lower interlayer insulating film 220, that is, the first and second region second interlayer wiring structures 235-1 and 235-2.

More specifically, the second upper interlayer insulating film 270 may be formed on the first and second region second interlayer wiring structures 235-1 and 235-2 including the recess 235*r*.

The second upper interlayer insulating film 270 may be formed, so that an air gap 270*g* may be formed at a position corresponding to the recess 235*r*.

Since the recess 235*r* formed in the first region second interlayer wiring structure 235-1 is formed between the first region second metal wirings 230-1, the air gap 270*g* is formed between the first region second metal wirings 230-1.

The second upper interlayer insulating film 270 may include at least one, of silicon oxide, silicon nitride, silicon oxynitride, and/or a low-k material, for example. The second upper interlayer insulating film 270 may be formed by, for example, chemical vapor deposition (CVD), spin coating, plasma enhanced CVD (PECVD), high density plasma CVD (HDP-CVD), and so on.

Figure 18:
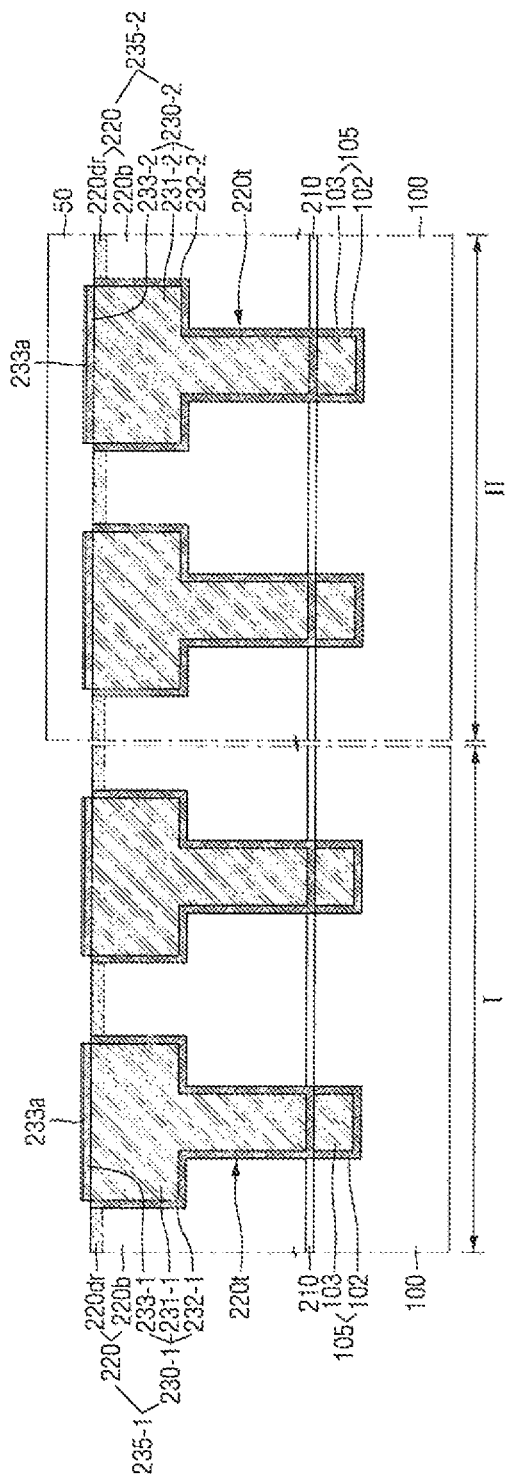
FIGS. 18 to 22 are cross-sectional views illustrating intermediate stages in methods of fabricating semiconductor devices according to some embodiments of the inventive concepts.

FIGS. 18 to 22 are cross-sectional views illustrating intermediate stages in methods of fabricating semiconductor devices according to some embodiments of the inventive concepts, FIG. 18 may illustrate a process performed, for example, after FIG. 11.

Referring to FIG. 18, a mask pattern 50 may be formed on the second region II of the substrate 100 The mask pattern 50 may be formed on the second region second interlayer wiring structure 235-2.

As a result, the first region second interlayer wiring structure 235-1 may be exposed by the mask pattern 50.

In some embodiments, an insert film may be further formed between the mask pattern 50 and the first and second region second interlayer wiring structures 235-1 and 235-2.

Figure 19:
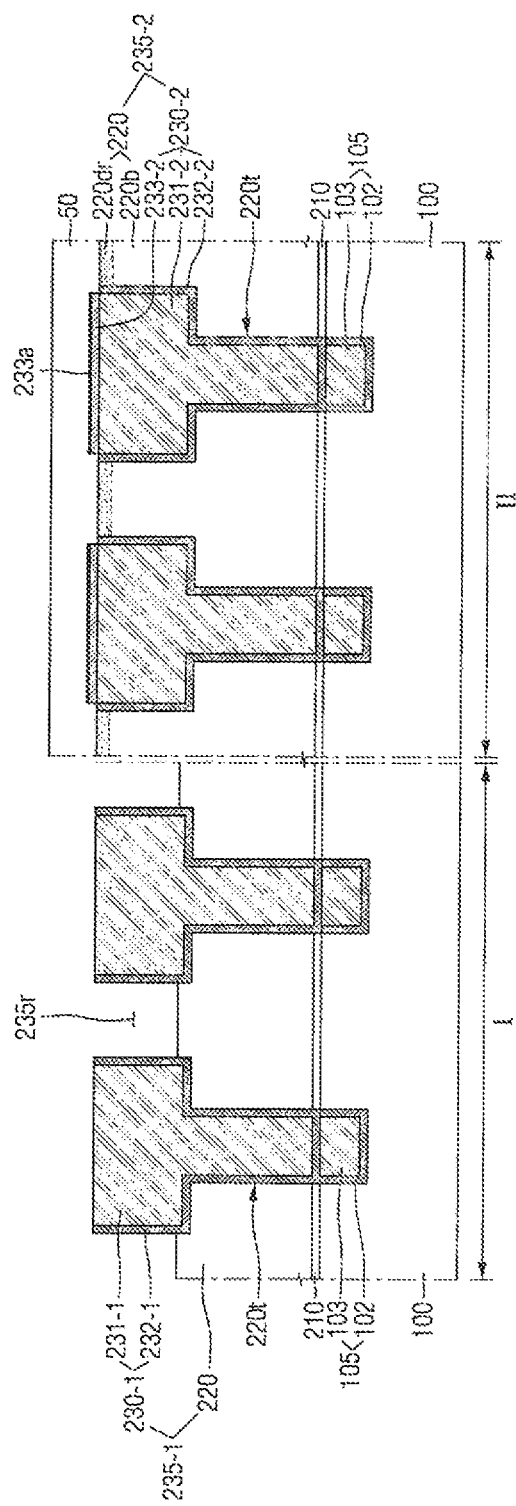

Referring to FIG. 19, using the mask pattern 50, a portion of the second lower interlayer insulating film 220 in the first region I may be removed.

The portion of the second lower interlayer insulating film 220 in the first region I may be removed to form a recess 235*r* in the first region second interlayer wiring structure 235-1.

During, forming of the recess 235*r*, the second damaged region 220*dr* included in the second lower interlayer insulating film 220 in the first region I may be removed.

After forming of the recess 235*r*, the mask pattern 50 may be removed.

In some embodiments, after forming of the recess 235*r*, surfaces of the first region second metal wirings 230-1 may be exposed to the air, so that metal oxide films may be formed on the surfaces of the first region second metal wirings 230-1, for example, the surfaces of the second upper pattern 231-1.

Figure 20:
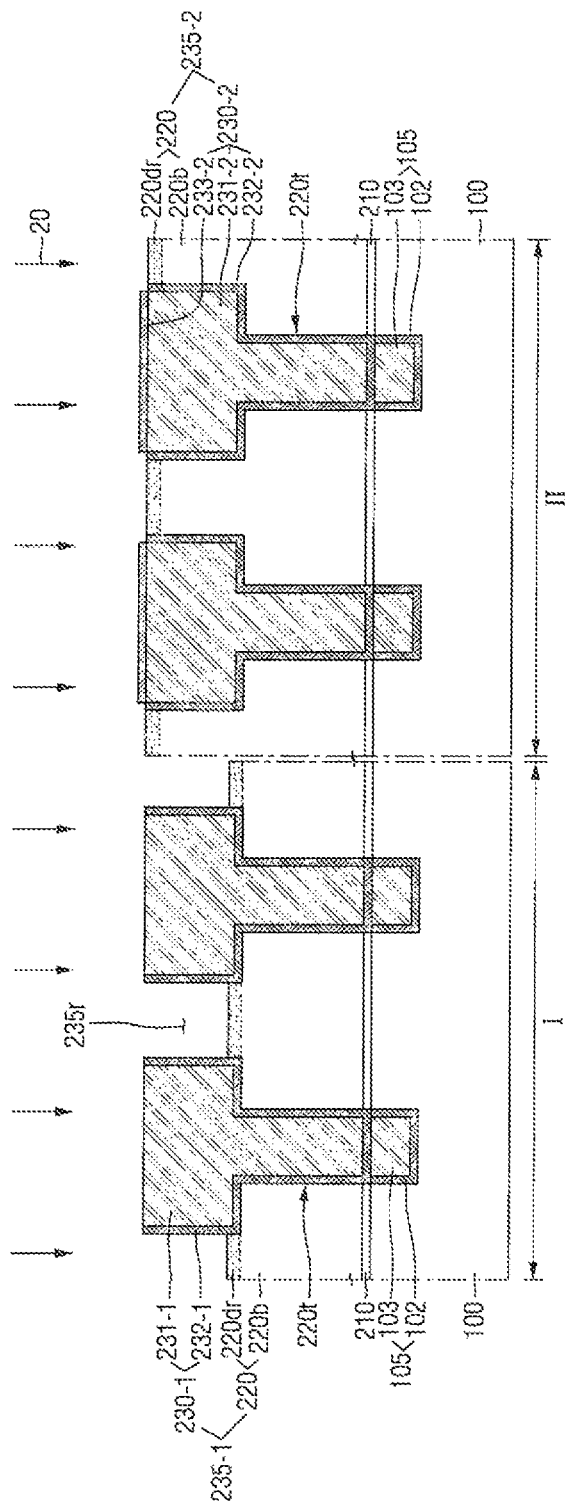

Referring to FIG. 20, by the first surface treatment process 20 using plasma, the surface of the first region second metal wirings 230-1 and the surface of the second region second metal wirings 230-2 may be surface-treated.

The first surface treatment process 20 may reduce the metal oxide film formed on the surface of the first region second metal wirings 230-1 and the second metal oxide film 233*a* formed on the surface of the second region second metal wirings 230-2.

Further, the first surface treatment process 20 may adsorb silicon onto the surface of the first region second metal wirings 230-1 and the surface of the second region second metal wirings 230-2, For example, silicon may be adsorbed onto the upper surface of the second metal pattern 231-1 of the first region second metal wirings 230-1, and the upper surface of the second capping conductive patterns 233-2 of the second region second metal wirings 230-2, but embodiments are not limited thereto.

During the first surface treatment process 20, the second lower interlayer insulating film 220 in the second region II exposed to plasma may be further damaged by the plasma, but embodiments are not limited thereto.

Further, during the first surface treatment process 20, a portion of the second lower interlayer insulating film 220 in the first region I may be damaged. As a result, the second damaged region 220*dr* may be formed on the second lower interlayer insulating film 220 in the first region I.

Figure 21:
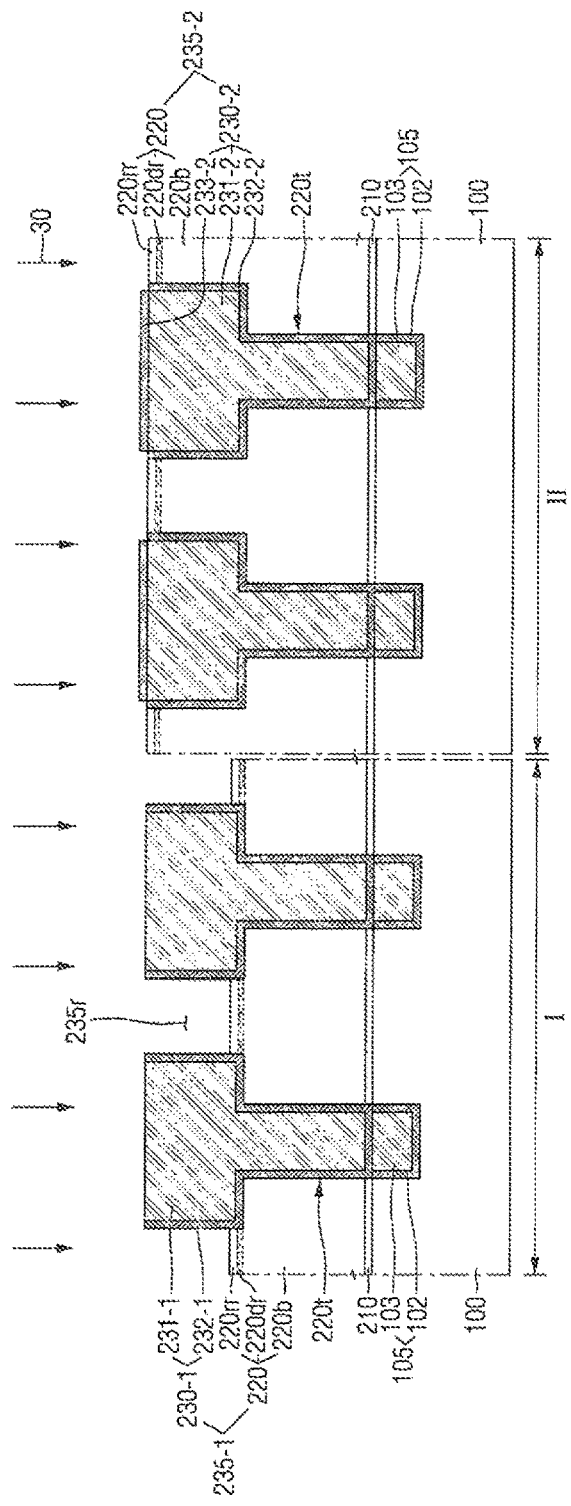

Referring to FIG. 21, by the second surface treatment process 30, the damaged surface of the second lower interlayer insulating film 220 may be surface-treated. The second surface treatment process 30 may surface-treat a surface of the second lower interlayer insulating film 220 damaged by the first surface treatment process 20.

The second surface treatment process 30 may change at least a portion of the second damaged region 220*dr* to the second recovery region 220*rr*.

Figure 22:
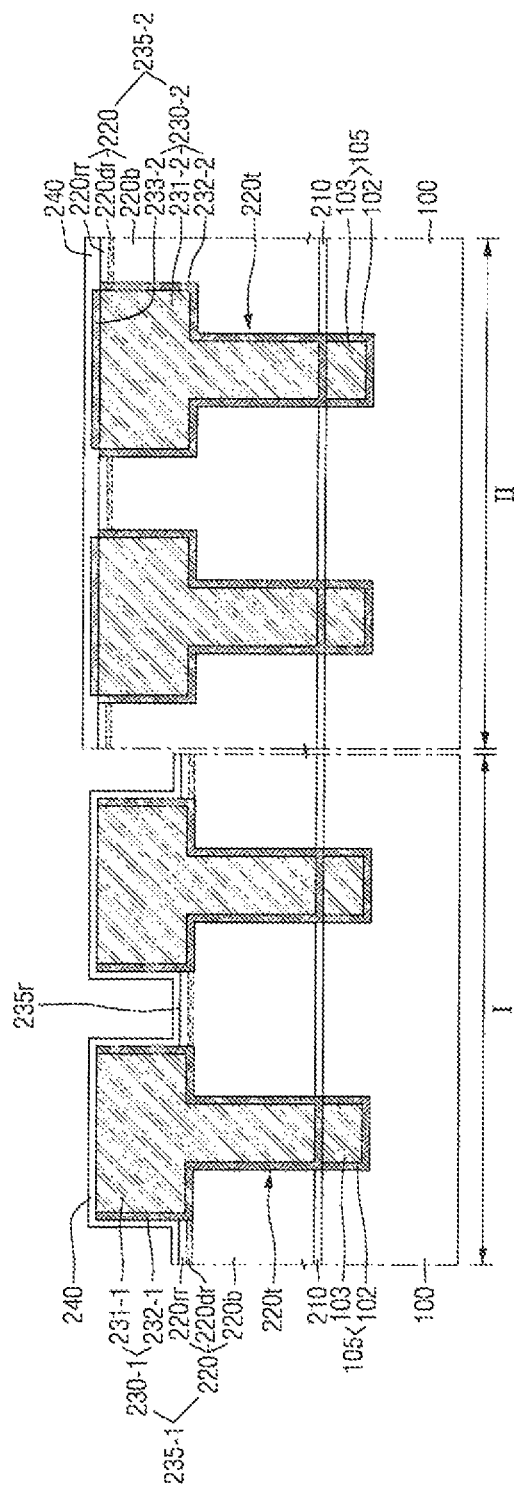

Referring to FIG. 22, a second upper etch stop layer 240 may be formed along a profile of the protruded first region second metal wirings 230-1, the upper surface of the second region second metal wirings 230-2 in the second region II and the upper surface of the second lower interlayer insulating film 220 in the second region II.

Then, as shown in FIG. 17, the second upper, interlayer insulating film 270 may be formed on the second upper etch stop layer 240, so that an air gap 270*g* may be formed between the first region second metal wirings 230-1.

Figure 23:
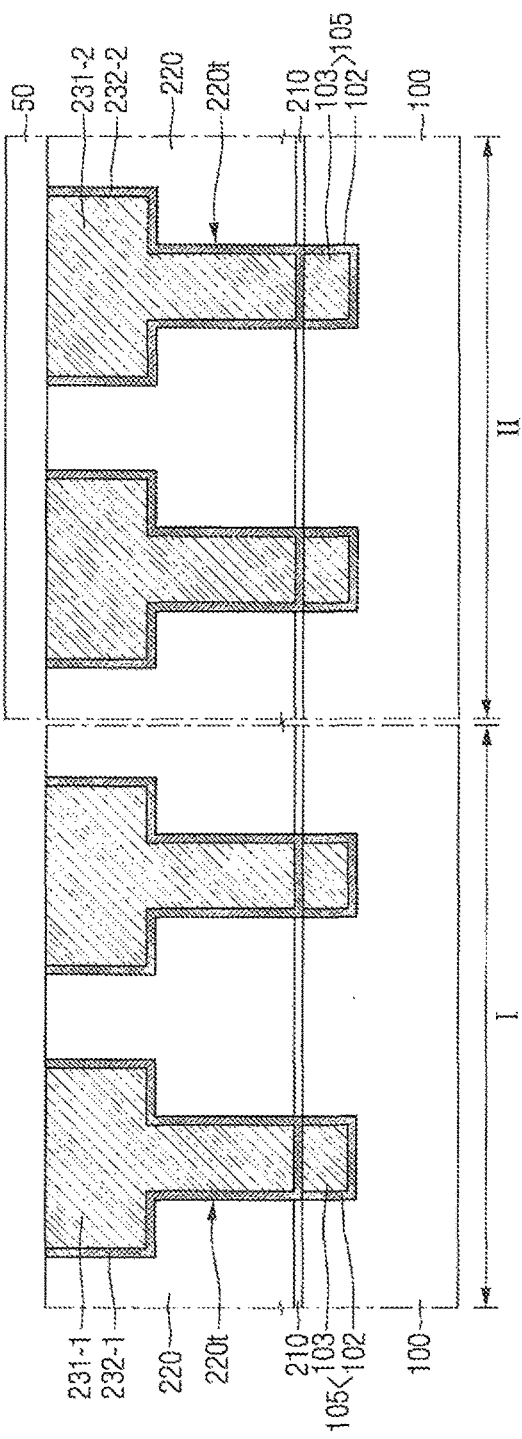
FIGS. 23 to 25 are cross-sectional views illustrating intermediate stages in methods of fabricating semiconductor devices according to some embodiments of the inventive concepts.
Figure 24:
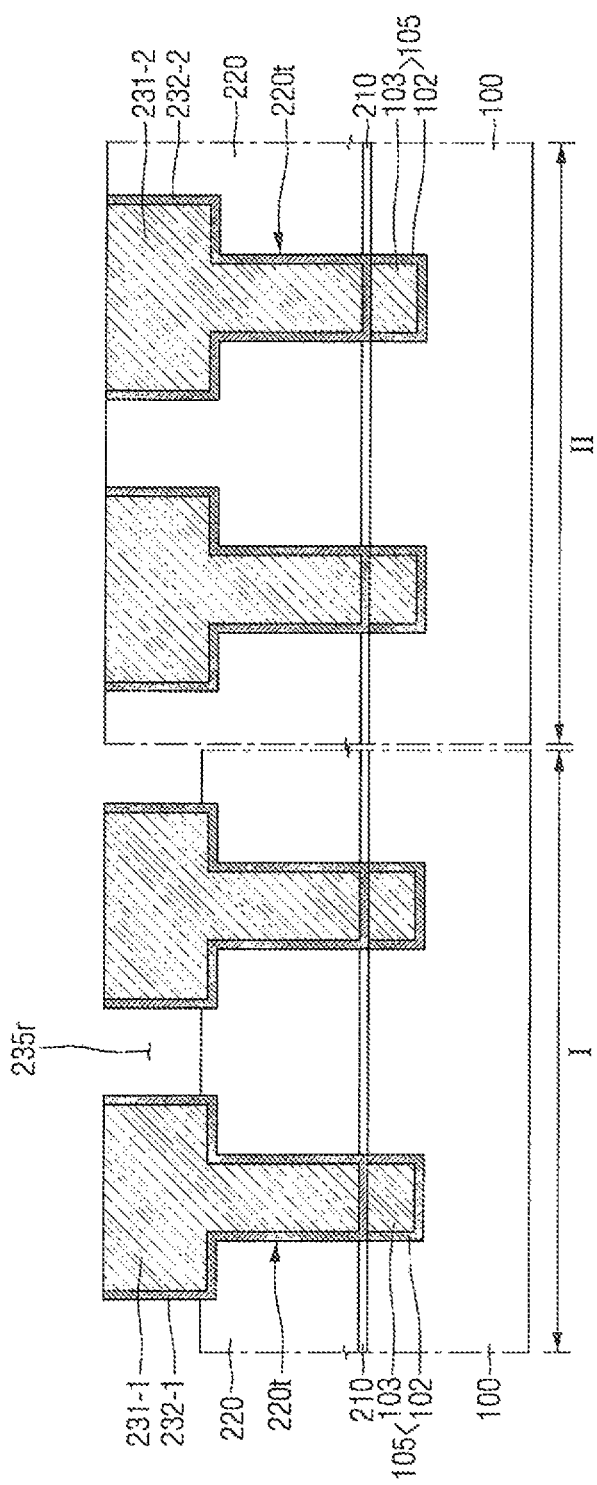
Figure 25:
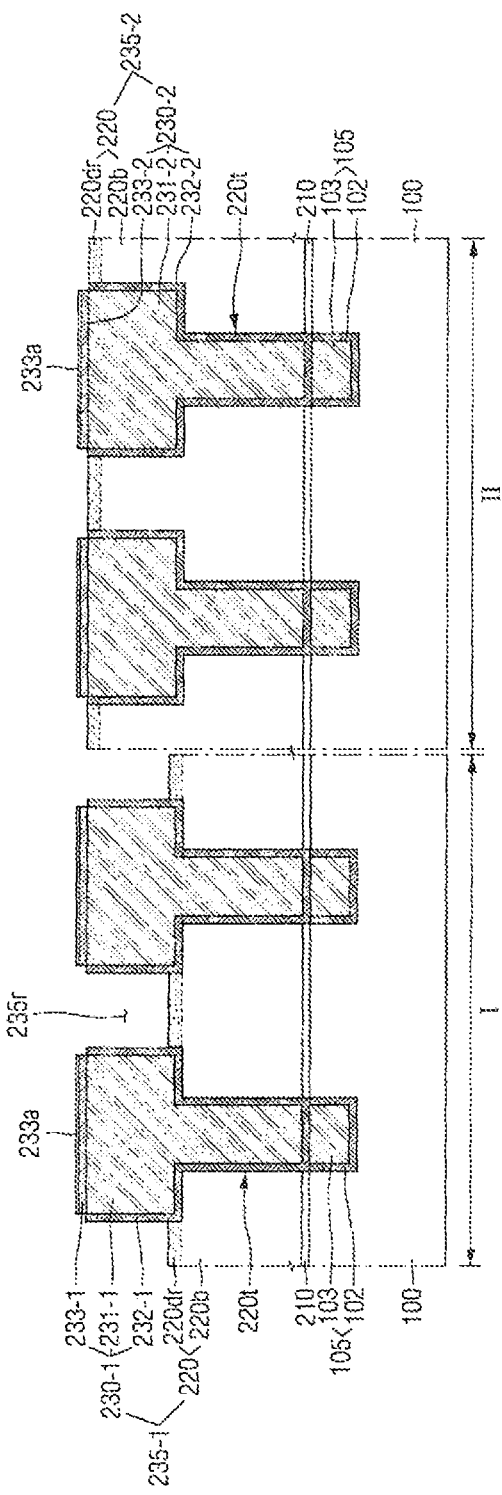

FIGS. 23 to 25 are cross-sectional views illustrating intermediate stages in methods of fabricating semiconductor devices according to some embodiments of the inventive concepts.

Figure 10:
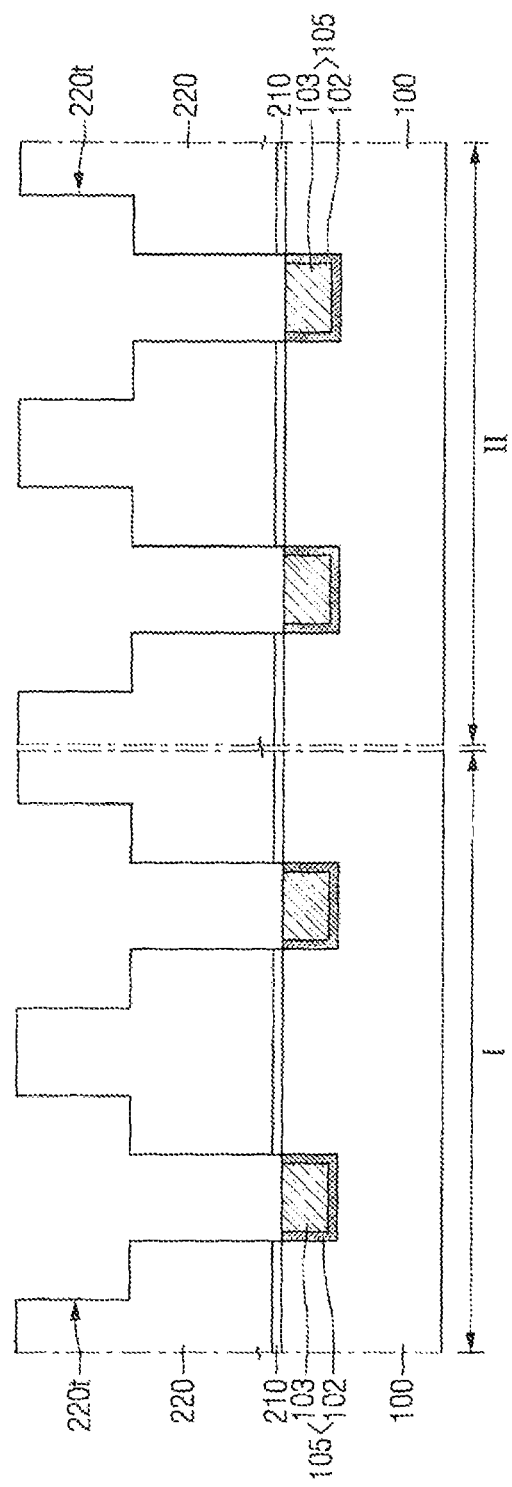
FIGS. 10 to 17 are cross-sectional views illustrating intermediate stages in methods of fabricating semiconductor devices according to some embodiments of the inventive concepts.

FIG. 23 may illustrate a process performed, for example, after FIG. 10.

Referring to FIG. 23, the second barrier films 232-1 and 232-2 may be formed along the sidewall and the bottom surface of the second trenches 220t.

The second metal patterns 231-1 and 231-2 may be formed to fill the second trenches 220t on the second barrier films 232-1 and 232-2.

The upper surfaces of the second metal patterns 231-1 and 231-2 formed in the second lower interlayer insulating film 220 may be exposed.

Then, a mask pattern 50 may be formed on the second region II of the substrate 100. The mask pattern 50 may be formed on the second lower interlayer insulating film 220 in the second region II.

In some embodiments, the metal oxide film may be formed on the upper surfaces of the second metal patterns 231-1 and 231-2, which may be formed by oxidization of the second metal patterns 231-1 and 231-2.

Referring to FIG. 24, using the mask pattern 50, a portion of the second lower interlayer insulating film 220 in the first region I may be removed.

The portion of the second lower interlayer insulating film 220 in the first region I may be removed to form a recess 235r in the second lower interlayer insulating film 220.

In other words, the portion of the second lower interlayer insulating film 220 between the second metal patterns 231-1 in the first region I may be removed to form the recess 235r.

After the recess 235r is formed, a portion of the second metal pattern 231-1 and a portion of the second barrier film 232-1 in the first region I may protrude upward higher than the upper surface of the second lower interlayer insulating film 220 in the first region I.

After firming of the recess 235r, the mask pattern 50 may be removed.

Referring to FIG. 25, the second capping conductive, patterns 233-1 and 233-2 may be formed on the second metal patterns 231 and 231-2 in the first region I and the second region II.

As a result, the first and second region second interlayer wiring, structures 235-1 and 235-2, including the first and second region second metal wirings 230-1 and 230-2 and the second lower interlayer insulating film 220, may be formed, on the substrate 100.

A portion of the first region second metal wirings 230-1 may protrude upward higher than the upper surface of the second lower interlayer insulating film 220. Further, the recess 235r may be located between the first region second metal wirings 230-1.

More specifically, the metal oxide film formed on the second metal patterns 231-1 and 231-2 may be reduced so that the metal oxide formed on the upper surfaces of the second metal patterns 231-1 and 231-2 may be removed.

During removal of the metal oxide on the upper surfaces of the second metal patterns 231-1 and 231-2, the second lower interlayer insulating film 220 exposed to plasma may be damaged. As a result, the second damaged region 220dr may be formed on the upper portion of the second lower interlayer insulating film 220. The second damaged region 220dr may span the first region i and the second region II.

FIG. 25 illustrates that the second, capping conductive patterns 233-1 of the first region second metal wirings 230-1 do not extend in the vertical direction of the substrate 100 along the second barrier films 232-1 protruding further than the second lower interlayer insulating film 220, but embodiments are not limited thereto. In some embodiments, the second capping conductive patterns 233-1 of the first region second metal wirings 230-1 may be deposited along profiles of the protruded second metal patterns 231-1 and second barrier films 232-1.

After forming of the second capping conductive patterns 233-1 and 233-2, the second capping conductive patterns 233-1 and 233-2 may be brought into contact with air, so that the second metal oxide films 233a may be formed on the surface of the second capping conductive patterns 233-1 and 233-2.

In concluding the detailed description, those skilled in the art will appreciate that many variations and modifications can be made to the embodiments without substantially departing from the principles of the present inventive concepts. Therefore, the disclosed embodiments of the inventive concepts are used in a generic and descriptive sense only and not for purposes of limitation.

What is claimed is:

1. A method for fabricating a semiconductor device comprising:
    forming a first interlayer insulating film having a trench therein on a substrate;
    filling at least a portion of the trench with a metal wiring region;
    exposing a surface of the metal wiring region and a surface of the first interlayer insulating film to a plasma in a first surface treatment process, wherein the first surface treatment process comprises adsorbing silicon onto the surface of the metal wiring region using a gas containing silane and reducing a metal oxide on the surface of the metal wiring region; then
    exposing the surface of the first interlayer insulating film to a recovery gas comprising a methyl group (—CH$_3$) in a second surface treatment process; and then
    forming an etch stop layer on the metal wiring region and the first interlayer insulating film.

2. The method of claim 1, wherein the first surface treatment process, the second surface treatment process, and forming the etch stop layer are performed in-situ.

3. The method of claim 1,
    wherein forming the metal wiring region comprises: forming a metal pattern in the trench and forming a capping conductive pattern extending along an upper surface of the metal pattern, and
    wherein the first surface treatment process treats a surface of the capping conductive pattern.

4. The method of claim 1,
    wherein the first interlayer insulating film comprises a first region and a second region,
    wherein the metal wiring region comprises a plurality of metal wiring regions in the first interlayer insulating film in the first region and a plurality of metal wiring regions in the first interlayer insulating film in the second region, and
    wherein the method further comprises forming a mask pattern on the etch stop layer in the second region and, after removing a portion of the first interlayer insulating film in the first region using the mask pattern, forming a second interlayer insulating film on the first interlayer insulating film.

5. The method of claim 4, wherein forming the second interlayer insulating film comprises forming an air gap between ones of the plurality of metal wiring regions in the first region.

6. The method of claim 1,
    wherein the first interlayer insulating film comprises a first region and a second region, wherein the metal wiring region comprises a plurality of metal wiring regions in the first interlayer insulating film in the first region and a plurality of metal wiring regions in the first interlayer insulating film in the second region, and wherein the method further comprises, before the first surface treatment process, forming a mask pattern on the first interlayer insulating film in the second region and removing a portion of the first interlayer insulating film in the first region using the mask pattern.

7. The method of claim 1, wherein the recovery gas comprises $Si(CH_3)_4$.

8. A method for fabricating a semiconductor device comprising:
forming an interlayer wiring structure comprising a metal wiring region and a first interlayer insulating film, an upper surface of the metal wiring region being exposed;
adsorbing silicon onto the exposed upper surface of the metal wiring region by a first surface treatment process using plasma, the first surface treatment process treating a surface of the metal wiring region and damaging a surface of the first interlayer insulating film;
by a second surface treatment process using a recovery gas containing methyl group (—$CH_3$) and plasma, treating the damaged surface of the first interlayer insulating film; and
after the first and second surface treatment processes, forming an etch stop layer on the interlayer wiring structure.

9. The method of claim 8, wherein the first surface treatment process and the second surface treatment process are consecutively performed in a chamber.

10. The method of claim 8, wherein the etch stop layer is formed in the same chamber as a chamber in which the first surface treatment process is performed.

11. The method of claim 8, wherein the first interlayer insulating film comprises a first region and a second region, the method further comprising:
removing a portion of the first interlayer insulating film in the first region to form a recess in the interlayer wiring structure; and
forming a second interlayer insulating film on the interlayer wiring structure,
wherein an air gap is formed in the interlayer wiring structure at a location corresponding to the recess.

12. The method of claim 11, wherein the recess is formed after forming the etch stop layer.

13. The method of claim 11, wherein the recess is formed between forming the metal wiring region and the first surface treatment process.

14. The method of claim 8, wherein the metal wiring region comprises a metal pattern formed in the first interlayer insulating film, and a capping conductive pattern extending along an upper surface of the metal pattern.

15. A method for fabricating a semiconductor device comprising:
forming an insulating film on a substrate;
forming a metal wiring region in the insulating film;
exposing a surface of the insulating film and a surface of the metal wiring region to a plasma in a first surface treatment process, wherein the first surface treatment comprises exposing the surface of the metal wiring region to a first gas that supplies silicon to the surface of the metal wiring region and a second gas that reduces a metal oxide on the surface of the metal wiring region; then
exposing the surface of the insulating film to a recovery gas in a second surface treatment, the recovery gas increasing a carbon concentration of the surface of the insulating film, wherein the recovery gas of the second surface treatment makes the insulating film hydrophobic; and then
forming an etch stop layer on the metal wiring region and the insulating film.

16. The method of claim 15,
wherein the first gas comprises silane,
wherein the second gas comprises ammonia, and
wherein the recovery gas comprises a methyl group.

17. The method of claim 15, wherein the metal wiring region comprises a plurality of metal wiring regions in the insulating film, the method further comprising forming an air gap between ones of the plurality of metal wiring regions.

18. The method of claim 17,
wherein the substrate comprises a first region and a second region,
wherein the insulating film is formed on the first region and the second region of the substrate,
wherein the plurality of metal wiring regions are formed on the first region and the second region of the substrate, and
wherein the air gap is formed between ones of the plurality of metal wiring regions in the first region and not formed between ones of the plurality of metal wiring regions in the second region.

* * * * *